United States Patent
Nakamura et al.

(10) Patent No.: US 8,754,350 B2
(45) Date of Patent: Jun. 17, 2014

(54) LASER PROCESSING APPARATUS, EXPOSURE APPARATUS AND EXPOSURE METHOD

(75) Inventors: Osamu Nakamura, Kanagawa (JP); Hiroko Yamamoto, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 1588 days.

(21) Appl. No.: 11/527,640

(22) Filed: Sep. 27, 2006

(65) Prior Publication Data

US 2007/0070319 A1    Mar. 29, 2007

(30) Foreign Application Priority Data

Sep. 28, 2005  (JP) ................. 2005-281610

(51) Int. Cl.
*B23K 26/00* (2014.01)
*G03B 27/52* (2006.01)
*G03C 1/52* (2006.01)

(52) U.S. Cl.
USPC ............ 219/121.71; 355/55; 355/66; 355/67; 355/53; 355/77; 430/166; 430/487; 430/795

(58) Field of Classification Search
USPC ......... 219/121.71; 355/55, 66, 67, 53, 50, 77, 355/51; 430/166, 487, 795
See application file for complete search history.

(56) References Cited

U.S. PATENT DOCUMENTS

| | | | |
|---|---|---|---|
| 5,005,969 A | | 4/1991 | Kataoka |
| 5,285,236 A | * | 2/1994 | Jain ................................. 355/53 |
| 5,932,118 A | | 8/1999 | Yamamoto et al. |
| 5,946,024 A | | 8/1999 | Nishiwaki |
| 6,160,611 A | | 12/2000 | Miyake |
| 6,593,064 B1 | | 7/2003 | Gelbart |
| 2002/0191301 A1 | * | 12/2002 | Tanaka ........................... 359/668 |
| 2003/0180983 A1 | * | 9/2003 | Oswald et al. ................... 438/57 |
| 2004/0021845 A1 | * | 2/2004 | Kawahara ........................ 355/67 |
| 2004/0152233 A1 | * | 8/2004 | Nemets et al. ................. 438/106 |

(Continued)

FOREIGN PATENT DOCUMENTS

| | | |
|---|---|---|
| EP | 0 720 035 A2 | 7/1996 |
| EP | 0 924 571 A2 | 6/1999 |

(Continued)

OTHER PUBLICATIONS

JP2005077883A.pdf machine translation.*

(Continued)

*Primary Examiner* — Dana Ross
*Assistant Examiner* — Ket D Dang
(74) *Attorney, Agent, or Firm* — Nixon Peabody LLP; Jeffrey L. Costellia

(57) ABSTRACT

An exposure apparatus includes a stage 10 for holding a substrate 8 to be exposed; a direct writing mask 6 arranged above the substrate 8 to be exposed held by the stage 10; a repeated opening pattern in which a plurality of openings each having approximately the same size are arranged in a line at approximately the same interval, provided to the mask; an irradiation mechanism for irradiating with a linear laser beam 1c along the repeated opening pattern; and a movement mechanism for moving a relative position of a laser beam which is formed in such a way that the linear laser beam formed by the laser processing mechanism passes through the plurality of openings of the opening pattern and the substrate held by the stage.

12 Claims, 28 Drawing Sheets

(56) References Cited

U.S. PATENT DOCUMENTS

| | | | |
|---|---|---|---|
| 2004/0152323 A1 | 8/2004 | Suzuki et al. | |
| 2004/0174512 A1 | 9/2004 | Toyoda et al. | |
| 2004/0233411 A1 | 11/2004 | Shiraishi | |
| 2005/0068505 A1* | 3/2005 | Momose et al. | 353/97 |
| 2008/0008222 A1 | 1/2008 | Tanaka | |

FOREIGN PATENT DOCUMENTS

| | | | |
|---|---|---|---|
| JP | 08-078329 | 3/1996 | |
| JP | 08-240787 | 9/1996 | |
| JP | 08-250401 | 9/1996 | |
| JP | 11-237744 | 8/1999 | |
| JP | 2005077883 A * | 3/2005 | G02B 5/20 |
| JP | 2008-053526 | 3/2008 | |

OTHER PUBLICATIONS

Application No. 06019166.5—Search Report—Dated: Jan. 4, 2008.

* cited by examiner

LASER PROCESSING APPARATUS, EXPOSURE APPARATUS AND EXPOSURE METHOD

BACKGROUND OF THE INVENTION

1. Field of the Invention

The present invention relates to an exposure apparatus and an exposure method, and more particularly such an exposure apparatus and an exposure method in which direct writing can be performed at high speed without using a photomask, and low cost can be realized.

2. Description of the Related Art

Before, it had been expected that a PDP (Plasma Display Panel) is used for a large sized television and a liquid crystal television is used for a medium or small sized television. However, since a liquid crystal television has better image quality and longer lifetime than a PDP, the liquid crystal television has been remarkably advanced and has been beginning to be targeted at a large-sized TV market of 30 inches or more. For that reason, liquid crystal factories where large-sized glass substrates of 4 $m^2$ class are used have been established.

When electronic circuits are formed over a large-sized glass substrate, a photolithography technique plays an active part. A photomask matched with specifications and a design of a display device is prepared beforehand, and a photoresist is exposed by being irradiated with exposure light through the photomask. According to this technique, electronic circuits which are miniaturized to a micrometer size can be integrated on a large scale (for example, refer to the patent document 1, Japanese Patent Laid-Open No. H8-250401).

SUMMARY OF THE INVENTION

With a large-sized glass substrate of 4 $m^2$ class, it is technically difficult to manufacture an exposure apparatus in which a large-sized photomask which corresponds with the size of the substrate can be used. Since light-exposure is performed in a step-and-repeat manner using a small-sized photomask, plenty of time is spent on light-exposure processes. Moreover, since it is difficult to connect steppers to each other in an exposure apparatus and much time is spent on steps for repairing (connecting and fixing), a light-exposure step becomes one factor of high cost. Furthermore, a new photomask is required to be manufactured whenever a new product is changed; manufacturing the new photomask is also causing another factor of high cost.

On the other hand, as an exposure method without using a photomask, a method using a direct writing system using an electron beam and a laser beam is proposed. However, low cost cannot be achieved compared with the exposure method using the photomask since tact is extremely bad as is generally known. In a method using a polygon lens or galvano lens, writing at relatively high speed is realized; however, there is a trade-off relationship between speed and writing accuracy, and the method does not take the place of the exposure apparatus using the photomask. Also there is a future for an exposure apparatus using a Digital Micro mirror Device (DMD); however, there is no device like the exposure apparatus using the photomask in which both of the tact and accuracy are satisfied.

The present invention has been made in consideration of the above circumstances. An object of the present invention is to provide a laser processing apparatus, in particular, an exposure apparatus and an exposure method in which direct writing can be performed at high speed without using a photomask, and low cost can be realized.

In order to solve the problems, the laser processing apparatus according to the present invention includes a stage for holding a substrate; a mask which is arranged above the substrate held by the stage; at least one opening pattern in which a plurality of openings each having approximately the same size are arranged in a line at approximately the same interval, provided to the mask; a laser processing mechanism for forming a linear laser beam; and a movement mechanism for moving a relative position of a laser beam which is formed in such a way that the linear laser beam formed by the laser processing mechanism passes through the plurality of openings of the opening pattern and the substrate held by the stage. In this specification, "openings of a mask (for writing directly) have approximately the same size" and "openings of a mask (for writing directly) have approximately the same interval" mean "a slightly variation of sizes of the openings is within 5%", and "a slightly variation of intervals of the openings at intervals is within 5%.", respectively.

Moreover, in a laser processing apparatus according to the present invention, the opening pattern may include several kinds. In a laser processing apparatus according to the present invention, the plurality of the openings may have a shape of a circle, an ellipse, or a polygon. Furthermore, in a laser processing apparatus according to the present invention, an irradiation area where the mask is irradiated with the linear laser beam formed by the laser processing mechanism is preferably larger than the one opening pattern.

Furthermore, the laser processing apparatus according to the present invention may be equipped with a light shielding mechanism for blocking one part of the linear laser beam which irradiates the opening pattern.

In order to solve the problems, an exposure apparatus according to the present invention includes a stage for holding a substrate to be exposed; a direct writing mask (a mask for writing directly) which is arranged above the substrate to be exposed that is held by the stage; at least one opening pattern in which a plurality of openings each having approximately the same size are arranged in a line at approximately the same interval, provided to the direct writing mask; a laser processing mechanism for forming a linear laser beam; and a movement mechanism for moving a relative position of a laser beam which is formed in such a way that the linear laser beam formed by the laser processing mechanism passes through the plurality of openings of the opening pattern and the substrate to be exposed held by the stage.

Moreover, in an exposure apparatus according to the present invention, the opening pattern may include several kinds. In the exposure apparatus according to the present invention, the plurality of the openings may have a shape of a circle, an ellipse, or a polygon. Furthermore, in the exposure apparatus according to the present invention, an irradiation area where the direct writing mask is irradiated with the linear laser beam formed by the laser processing mechanism is preferably larger than the one opening pattern.

Furthermore, the exposure apparatus according to the present invention may be further equipped with a light shielding mechanism for blocking one part of the linear laser beam which irradiates the opening pattern.

An exposure method according to the present invention includes steps of: preparing a direct writing mask provided with an opening pattern in which a plurality of openings having approximately the same size are arranged in a line at approximately the same interval; irradiating the direct writing mask with a linear laser beam along the opening pattern; having the linear laser beam pass through the plurality of openings of the opening pattern so that the linear laser beam passed through the openings is formed as an exposure laser beam; and performing exposure for direct writing by moving a relative position of the exposure laser beam and the substrate to be exposed while irradiating the substrate to be irradiated with the exposure laser beam.

In an exposure method according to the present invention, the plurality of the openings may have a shape of a circle, an ellipse, or a polygon. Furthermore, in an exposure method according to the present invention, an irradiation area where the linear laser beam irradiation is performed along the opening pattern is preferably larger than the plurality of openings of the opening pattern.

In an exposure method according to the present invention, when the laser beam irradiation is performed along the opening pattern, one part of the linear laser beam may be blocked.

According to the present invention as described above, an exposure apparatus and exposure method in which low cost is realized can be provided since writing can be directly performed at high speed without using a photomask, and time and cost for manufacturing a new mask are not required.

DETAILED DESCRIPTION OF THE INVENTION

Embodiment Mode

Hereinafter, embodiment modes of the present invention are described with reference to drawings.

[Embodiment Mode 1]

Figure 1:
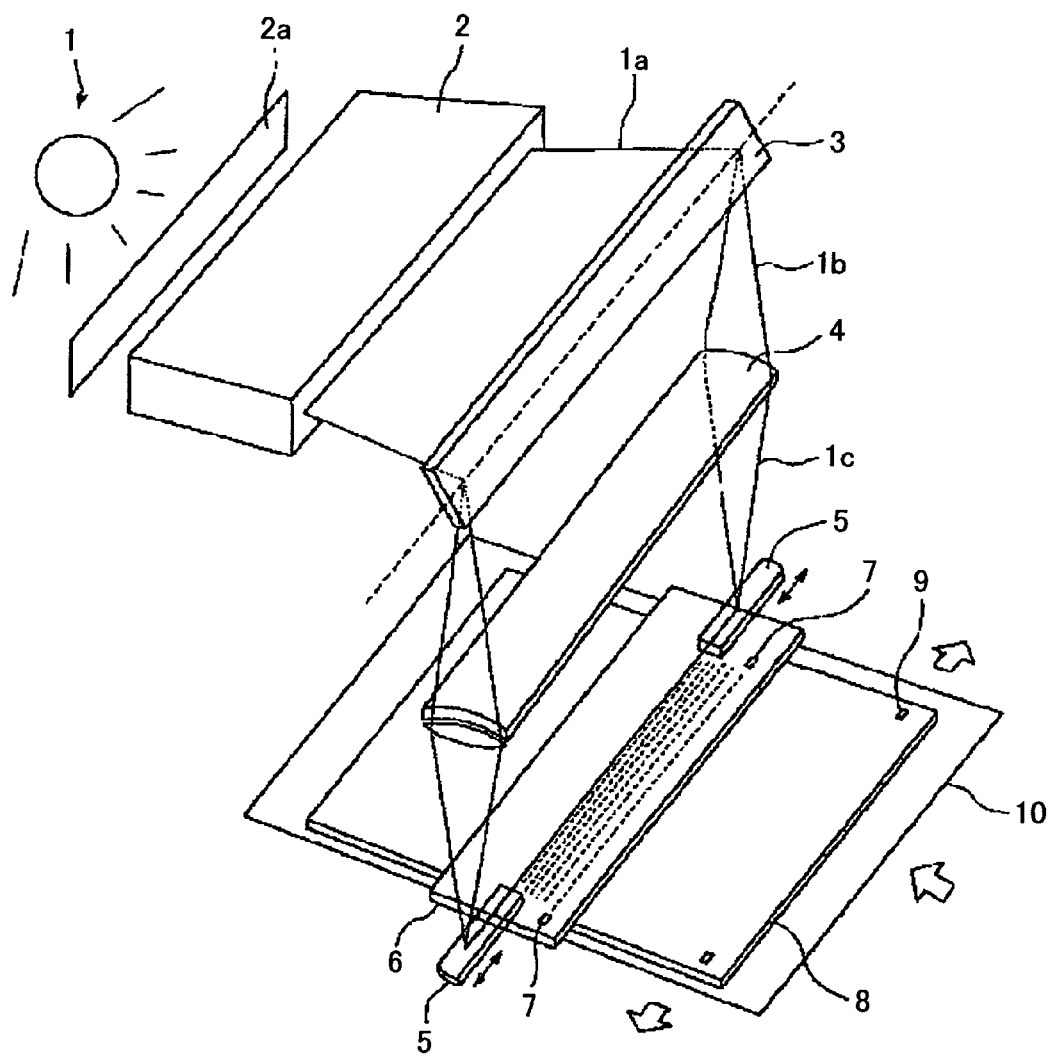
FIG. 1 is a perspective view showing a structure of an exposure apparatus for direct writing according to Embodiment Mode 1.
Figure 2A:
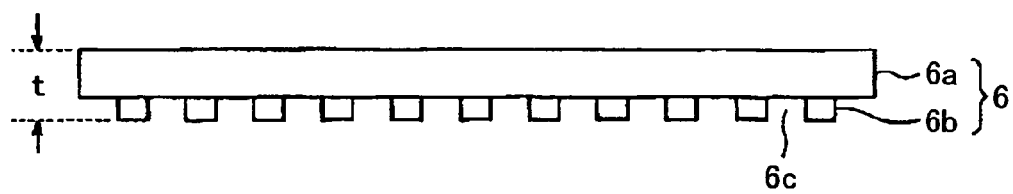
FIGS. 2A to 2C are cross sectional views showing a direct writing mask of the exposure apparatus according to FIG. 1, a deformation example thereof, and another deformation example thereof.
Figure 2B:
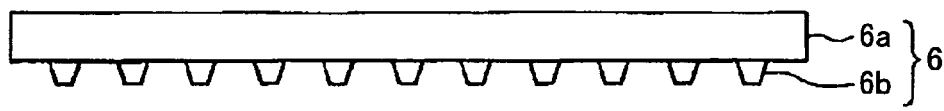
Figure 2C:
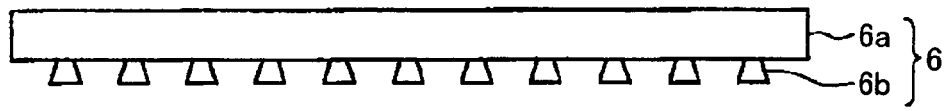
Figure 3:
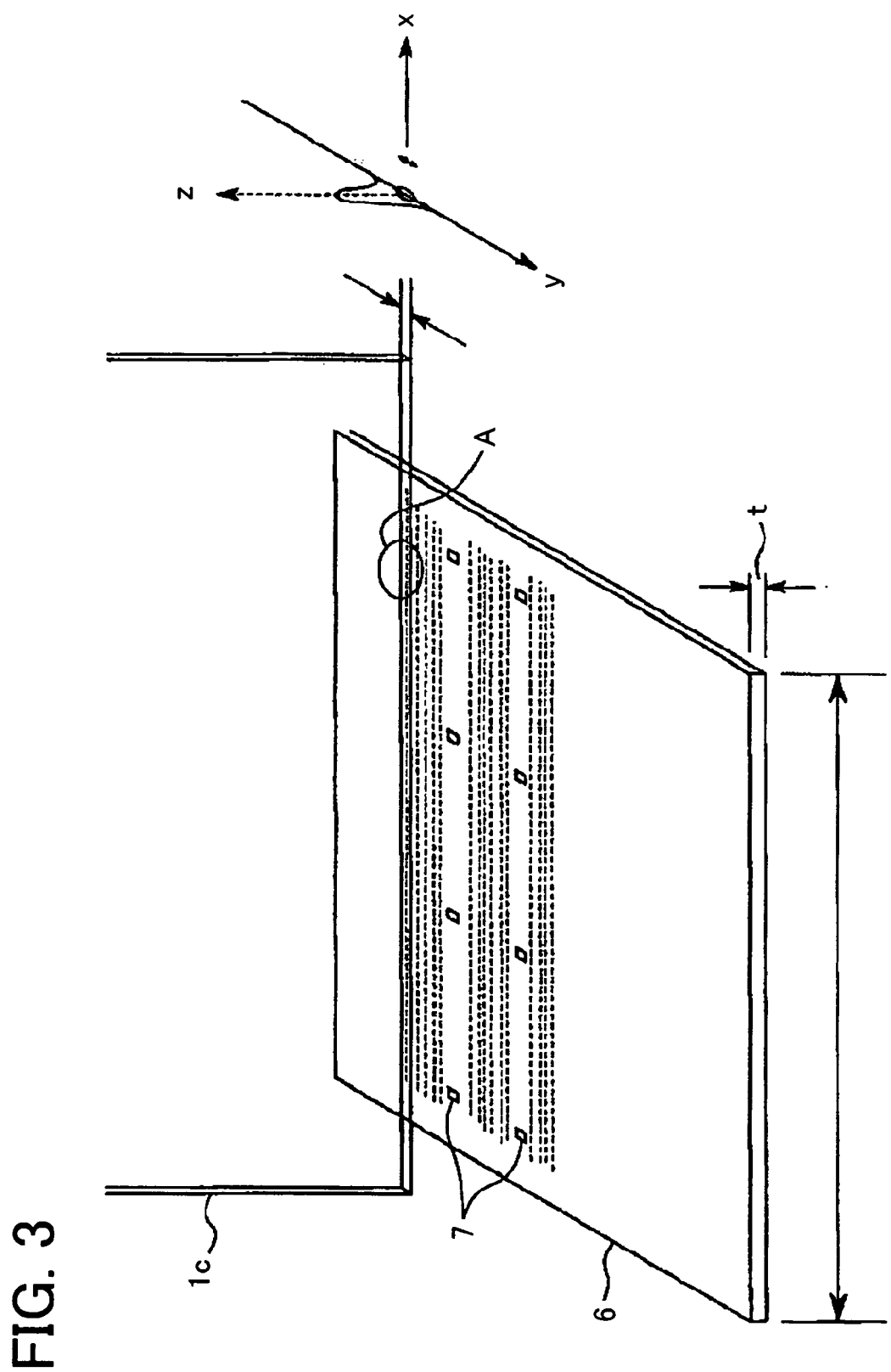
FIG. 3 is a patterned perspective view showing a state where a direct writing mask is supplied with a linear laser beam for exposure.
Figure 4:
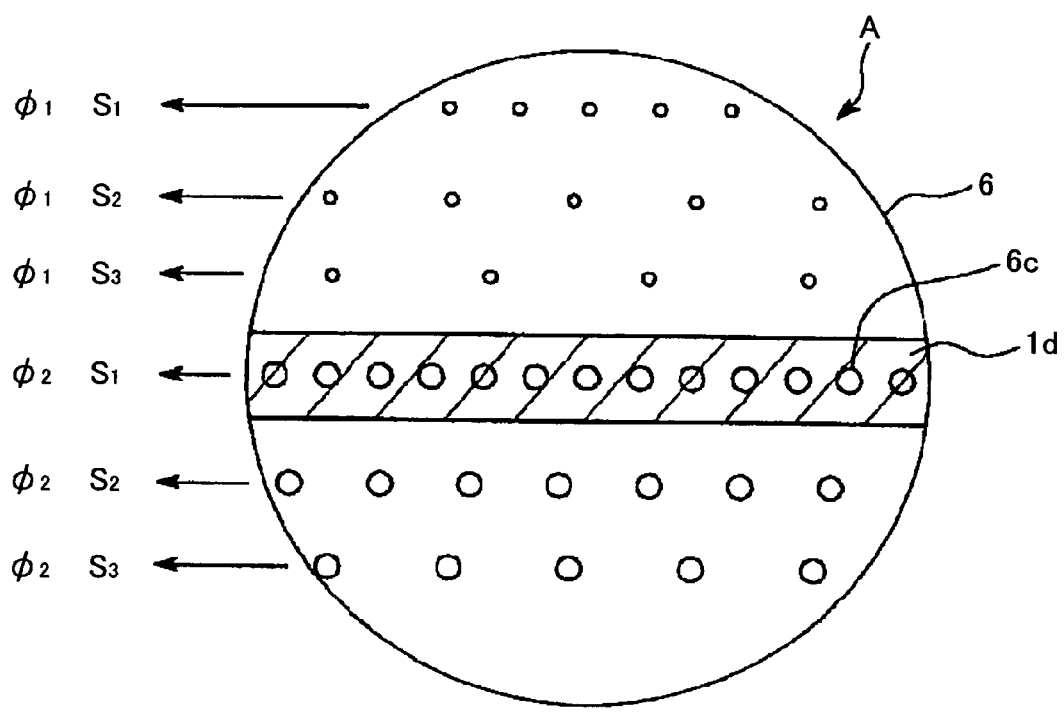
FIG. 4 is a plane view in which one part A of the direct writing mask shown in FIG. 3 is enlarged.
Figure 5:
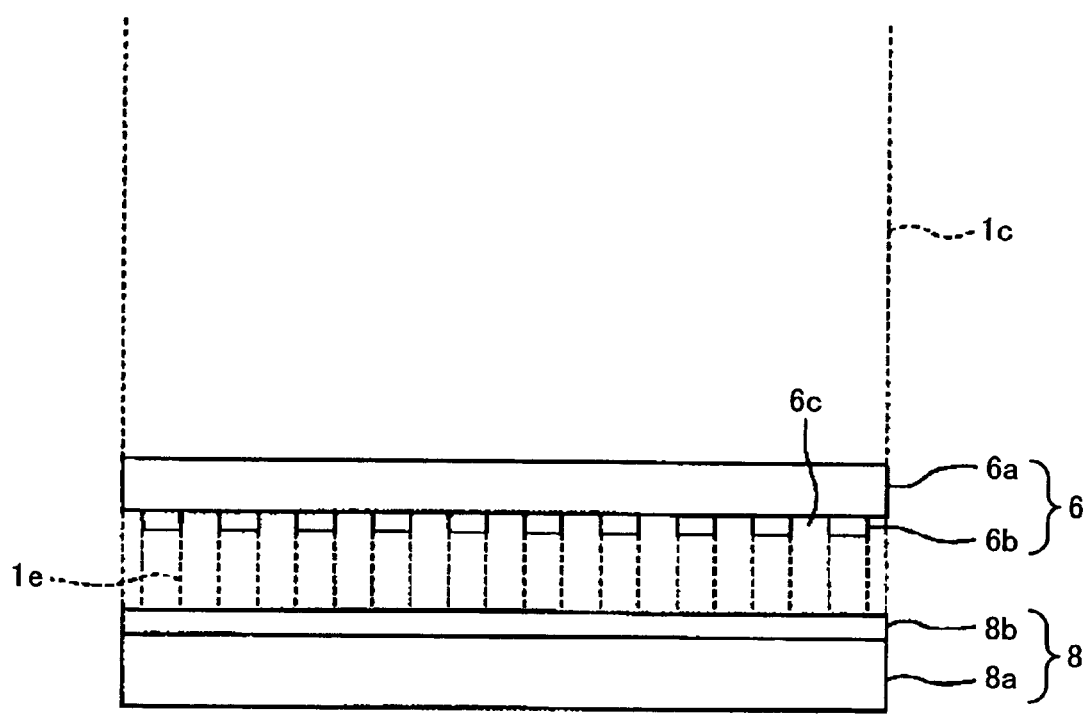
FIG. 5 is a patterned perspective view showing a state where a direct writing mask is supplied with a linear laser beam for exposure and a photoresist is exposed.

FIG. 1 is a perspective view showing a structure of a direct writing exposure apparatus according to Embodiment Mode 1 of the present invention. FIG. 2A is a cross sectional view showing a direct writing mask 6 (a mask functioning as a slit) of an exposure apparatus shown in FIG. 1. FIG. 2B is a cross sectional view showing a deformation example of the direct writing mask shown in FIG. 2A. FIG. 2C is a cross-sectional view showing another transformation example of the direct writing mask shown in FIG. 2A. FIG. 3 is a patterned perspective view showing a direct writing mask of the exposure apparatus in FIG. 1 and a state in which the direct writing mask is supplied with a linear laser beam for light exposure. FIG. 4 is a plan view in which a part of a direct writing mask shown in FIG. 3 is enlarged. FIG. 5 is a patterned cross sectional view showing a state where a direct writing mask is supplied with a linear laser beam for exposure and a photoresist is exposed.

The direct writing exposure apparatus shown in FIG. 1 has a light source 1 which generates an excimer laser beam. Here, the light source 1 of the excimer laser beam is used; however, it is not limited to this, and other light sources such as an extra-high pressure Hg lamp, X-rays, an ion beam, an electron beam, a solid state laser, a gas laser, a semiconductor laser, and the like can be used. In the case of using the extra-high pressure Hg lamp as a light source, a linear laser optical system 2, a mirror 3, and a doublet cylindrical lens 4 need not to be used. In this specification, all of the linear laser optical system 2, the mirror 3, the doublet cylindrical lens 4, and the like for forming a linear laser are referred to as an irradiation mechanism (a laser processing mechanism). Note that the irradiation mechanism is not limited to those shown here. For example, a doublet cylindrical lens may be a triplet cylindrical lens or the like.

The laser beam generated from the light source 1 is introduced into the linear laser optical system 2 through an on/off mechanism 2a. The laser beam operates such that the laser beam is introduced into the linear optical system 2 when the on/off mechanism 2a is turned on and the laser beam is not introduced into the linear optical system 2 when the on/off mechanism 2a is turned off. The linear laser optical system 2 has first to third cylindrical lens arrays, and first and second cylindrical lenses.

The first cylindrical lens array is subjected to the laser beam introduced from the light source 1 perpendicularly and the laser beam is divided into four (laser beams) in a first direction. Then the second cylindrical lens array is subjected to thus divided four laser beams perpendicularly and the laser beams are divided into seven (laser beams) in a second direction (direction perpendicular to the first direction). Subsequently, the third cylindrical lens is subjected to thud divided seven laser beams perpendicularly and then laser beams are divided into four (laser beams) in a third direction (the same direction as the first direction). These divided laser beams are synthesized into one by an optical element such as a doublet cylindrical lens. Accordingly, energy homogenization of the linear laser beam in a longitudinal direction is carried out, and therefore, the length of the linear laser beam in the longitudinal direction is determined.

The laser beam 1a synthesized by the linear laser optical system 2 as described is reflected by the mirror 3. Then, a reflected laser beam 1b is again condensed into one laser beam 1c at an irradiated surface by a doublet cylindrical lens 4. The doublet cylindrical lens 4 has a structure including two cylindrical lenses. Accordingly, energy homogenization of the linear laser beam in a lateral direction is carried out, and therefore, the length of the linear laser beam in the lateral direction is determined.

A direct writing mask 6 is irradiated with the linear laser beam 1c condensed by the doublet cylindrical lens 4 as described through a slit 5 that is a light shielding mechanism for blocking the laser beam. The slit 5 determines the length of the linear laser beam which arrives at the direct writing mask 6. That is, the slit 5 determines an exposure range. Furthermore, the direct writing mask 6 has an alignment marker 7 by which alignment of the direct writing mask 6 can be carried out. Note that the linear laser beam 1c is condensed to have the width of approximately 100 to 500 μm, and the length of approximately 10 to 200 μm. The shape of the linear laser beam is made rectangular, elliptical, or the like.

As shown in FIG. 2A, the direct writing mask 6 has a quartz substrate 6a, a metal film 6b, for example, a chrome film under the quartz substrate 6a provided with a plurality of openings 6c. The direct writing mask 6 has a thickness t of approximately 0.3 nm to 2 mm, and the planar shape is a quadrangle having approximately 100 mm to 2000 mm on a side as shown in FIG. 3. Moreover, the direct writing mask 6 is arranged so that the surface thereof is irradiated with the linear laser beam 1c. In this embodiment mode, although the side of the metal film 6b in the direct writing mask 6 has a shape perpendicular to the surface of the quartz substrate 6a as shown in FIG. 2A, it is not limited thereto, and the side of the metal film may have a shape (tapered shape) having an angle to the surface of the quartz substrate. For example, the side of the metal film 6d may have a tapered shape having an acute angle to the surface of the quartz substrate 6a, as shown in FIG. 2B; alternatively, the side of the metal film 6e may have a tapered shape having an obtuse angle to the surface of the quartz substrate 6a. The shape of the linear laser beam is preferably selected so that the spreading of the beams which has passed through the direct writing mask is reduced.

In the plurality of the openings of the direct writing mask 6, more than one opening patterns having the same size or shape (for example, a polygon such as a circle, an ellipse, a square, a rectangle, a quadrangle) are arranged in a line along a longitudinal direction of the linear laser beams used for irradiation, and a space between the adjacent openings are kept constant. Namely, repeated opening patterns in which the size of openings is the same with each other and the space (opening pattern cycle) between the openings is the same are arranged along the longitudinal direction of the linear laser beam. Furthermore, in a lateral direction of the linear laser beam of the direct writing mask 6, more than one repeated opening patterns as above, in which the size of the openings and the space between the openings are changed from the above are arranged. Note that each length of the openings is made shorter than the length of the linear laser beam in the lateral direction. Even if a direct writing mask with openings having the same size or the same interval tries to be fabricated according to a design, a slight variation in sizes of the openings or in intervals of the openings may cause. If a difference of sizes of the openings or a difference in intervals of the openings is within the slight variation (3% or less), the direct writing mask can be regarded as a direct writing mask with openings having the same size or the same interval in this specification.

To be concrete, in a portion A of the direct writing mask 6 shown in FIG. 4, first to sixth repeated opening patterns are sequentially arranged from above. For details, in the portion A, the first repeated opening patterns in which the size of an opening 6c is φ1 and a space between the openings is S1 are arranged. Under the first repeated opening patterns, the second repeated opening patterns in which the size of the opening 6c is φ1 and a space between the openings is S2 are arranged. Under the second repeated opening patterns, the third repeated opening patterns in which the size of the opening 6c is φ1 and a space between the openings is S3 are arranged. Under the third repeated opening patterns, the fourth repeated opening patterns in which the size of the opening 6c is φ2 and a space between the openings is S1 are arranged. Under the fourth repeated opening patterns, the fifth repeated opening patterns in which the size of the opening 6c is φ2 and a space between the openings is S2 are arranged. Under the fifth repeated opening patterns, the sixth repeated opening patterns in which the size of the opening 6c is φ2 and a space between the openings is S3 are arranged.

For example, in the case where the size φ of the opening is 2 μm, a space S between adjacent openings is 100 μm, and a size of the direct writing mask is 1000 mm×1000 mm, one repeated opening pattern includes ten thousand openings (holes). Furthermore, a phase shift mask can be used when the space between the openings is extremely small. Moreover, incident light may be focused with the use of a curve on the photomask by combining a micro lens array or etching a quartz part of the photo mask.

In the direct writing mask 6, openings each having variety size in the range of, for example, 1 μm to 50 μm, and repeated opening patterns in which a space between adjacent openings is changed variously in the range of, for example, 10 μm to 500 μm are preferably formed. By using the direct writing mask 6 with these repeated opening patterns, repeated patterns having a minimum width of 0.1 μm or more and a pattern interval (pitch) of 1 μm to 1000 μm can be directly written.

The fourth repeated opening patterns are irradiated with the linear laser beam 1c. The irradiation range 1d is a region which completely includes the openings and which is larger than the openings. Herewith, the beam intensity of the laser beam 1c which passes through the openings can be sufficiently heightened. Further, in the case where the laser beam 1c has an intensity distribution as shown in FIG. 3 (an x axis shows a longitudinal direction of the linear laser beam 1c; a y axis shows a lateral direction of the linear laser beam 1c, and a z axis shows the strength of the linear laser beam). The size of the opening "φ" of the direct writing mask 6 is desirably less than 4σ.

As shown in FIG. 1, the linear laser beam 1c irradiating the direct writing mask 6, irradiates a substrate 8 through the openings 6c of the direct writing mask 6. In detail, as shown in FIG. 5, the substrate 8 is a glass substrate 8a having a photoresist film 8b over the surface of the glass substrate 8a. The photoresist 8b of the substrate 8 is irradiated with an exposure laser beam 1e patterned in accordance with the openings 6c. Thus, the photoresist film 8b is exposed. Furthermore, the substrate 8 is arranged close to the direct writing mask 6 and has a structure according to an equal magnification exposure machine. Here, the substrate has the structure according to the equal magnification exposure machine; however, it may have a structure in which a projection lens system is interposed between the direct writing mask 6 and the substrate 8. The exposure apparatus of this invention has a height sensor (not shown) for detecting height position of the direct writing mask 6 from the substrate 8. By using the height sensor, the space between the direct writing mask 6 and the substrate 8 can be controlled precisely.

The substrate 8 has an alignment marker 9 shown in FIG. 1, and alignment of the substrate can be performed using the alignment marker 9. Here, the substrate 8 applied to the glass substrate 8a is used; however, other substrates such as a silicon wafer and a quartz glass substrate can be used. The substrate 8 is held on a stage 10, and this stage 10 is fixed over a vibration isolated table (not shown). Furthermore, the stage 10 has a movement mechanism (not shown) by which the stage is movable in a horizontal direction like an arrow.

The direct writing exposure apparatus is provided with a control section (not shown), and the control section controls the operation of the exposure apparatus described below. In details, the control section controls oscillation of an excimer laser beam from the light source 1, movement of the slit 5, movement of a stage, and the like.

A method for exposing by using the direct writing exposure apparatus is described. First, the direct writing mask 6 is prepared. By using the direct writing mask 6, direct writing can be performed if patterns formed over the photoresist film by exposure are repeated patterns in which patterns each having the same shape are arranged at the same interval like a pixel portion of a display device of such as a liquid crystal or EL.

Subsequently, a substrate 8 that is a light-exposure object is held on a stage 10. The substrate 8 includes a photoresist film 8b for forming patterns (for example, a pixel pitch of 300 μm) of a pixel portion on the substrate 8a.

Subsequently, repeated opening patterns in which a space between openings in the repeated opening pattern of the direct writing mask 6 is 300 μm is selected. As for the size of the opening, an adequate size of the opening is selected in consideration of the tact of the light-exposure and edge shape of the pattern. In other words, tact of light-exposure is improved with increase in size of an opening; however, since an edge of the pattern cannot be written sharply, it is desirable to select an appropriate size while considering the tact of the light-exposure and the edge shape of the pattern. A program for selecting an appropriate size automatically may be prepared so that the switching of the size is automatically performed by the program. Then, the substrate 8 and the direct writing mask 6 are aligned by the alignment markers 7 and 9 so that the pixel portions that should be exposed is located below the selected repeated opening patterns. Furthermore, the slit 5 is moved to determine the irradiation range of the linear laser beam. The area that is not repetition opening patterns such as driver circuits can block light with the slit 5.

Then the repeated opening patterns are irradiated with the linear laser beam 1c. By this, the photoresist film 8b of the substrate 8 is irradiated with the laser beam 1e for light exposure which has passed through the openings 6c of the direct writing mask 6. The substrate 8 is moved in a horizontal direction with the stage 10 so that the laser beam 1e for light exposure which has passed through the openings 6c writes a pattern for a pixel portion directly. In detail, the pattern for the pixel portion is written by repeatedly moving the substrate 8 by the length of the substrate 8 in the longitudinal direction of the linear laser beam 1c and by one pixel in the lateral direction of the linear laser beam 1c. Accordingly, in the photoresist 8b of the substrate 8, patterns in the pixel portion with a pixel pitch of 300 μm can be exposed.

Before or after performing the light exposure, the portion which has not been subjected to the repeated pattern (for example the portion other than the pixel) is exposed by a conventional exposure apparatus in which a photomask is previously manufactured.

By developing a photoresist film after light exposure, a resist pattern is formed over the substrate 8.

According to Embodiment Mode 1, by the combination of the linear laser beam 1c and the repeated opening pattern of the direct writing mask 6, repeated patterns of a plurality of pixels can be formed by one direct writing, to the number of the exposure laser beams 1e passed through the opening 6c of the direct writing mask. Therefore, direct writing can be performed at high speed, and the tact that is the biggest problem of the direct writing can be dissolved to shorten manufacturing time. As a result, low cost can be realized.

An exposure apparatus by this embodiment mode is for a direct writing, the direct writing mask 6 has versatility, and different patterns can be formed using the same direct writing mask 6; therefore, if the direct writing mask 6 is prepared, a new mask is not required to be prepared at a design renewal time for the light-exposure object. Therefore, the time for manufacturing a new mask is not required, the development period for a new product is shortened, and low cost can be realized. Though a direct writing mask with openings having the same size and the same interval is used in this embodiment mode, a mask having a slight variation of sizes of the openings within 5% (having approximately the same size) and a slight variation of intervals of the openings within 5% (having approximately the same size) can be also used as a direct writing mask.

Figure 6:
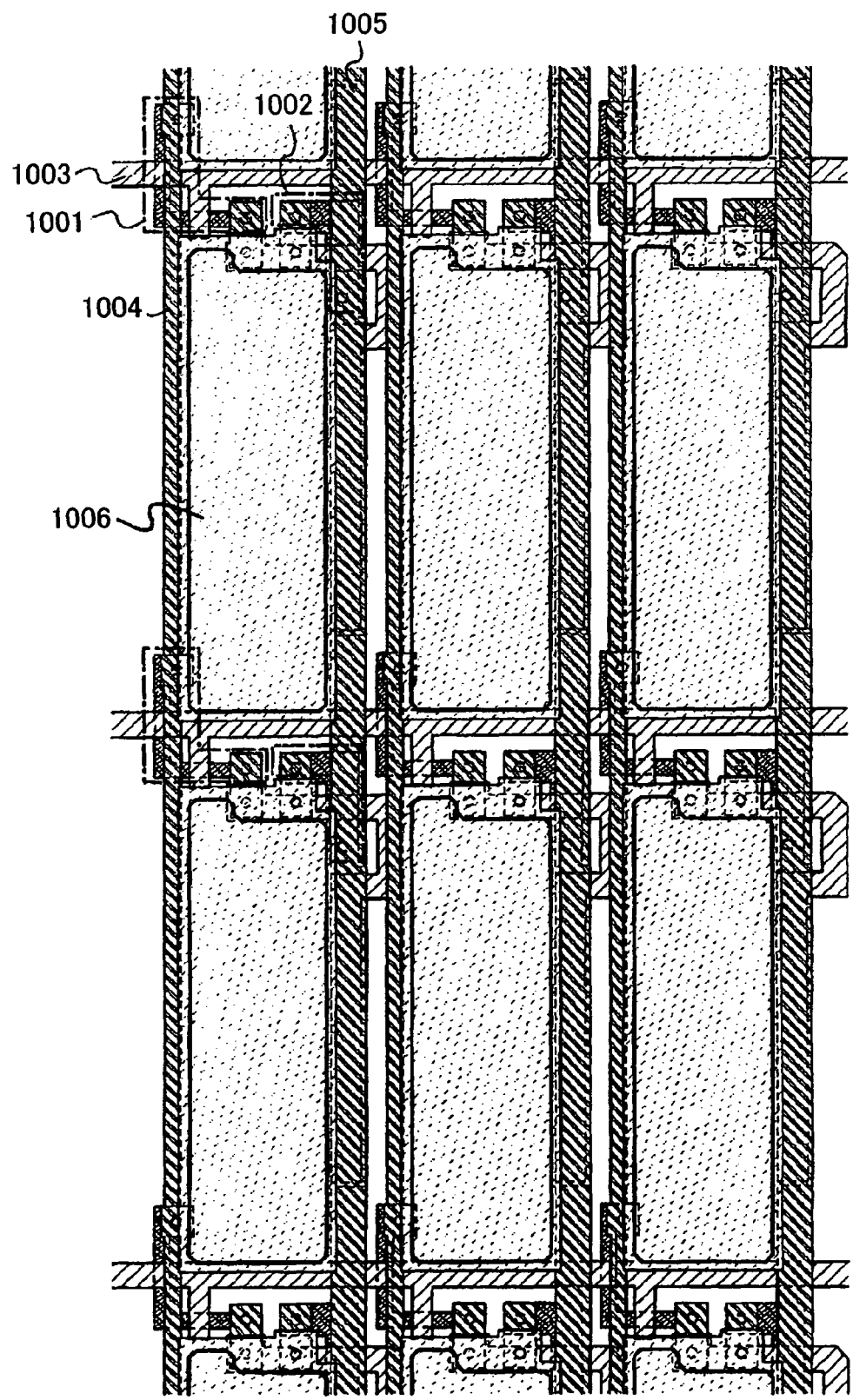
FIG. 6 is a top view showing one part of a pattern of a light emitting device in which light exposure can be carried out using the exposure apparatus of FIG. 1.

FIG. 6 is a top view showing a pattern of a part of a light emitting device, which is one example of the pattern where light exposure can be performed using the above mentioned exposure apparatus. The first electrode of a first transistor 1001 is connected to a source signal line 1004, and a second electrode is connected to the gate electrode of a second transistor 1002. The first electrode of the second transistor is connected to a current-supply line 1005, and the second electrode is connected to an electrode 1006 of the light emitting element. One part of the gate signal line 1003 functions as a gate electrode of the first transistor 1001.

The gate signal line 1003, the source signal line 1004, the current-supply line 1005, and the electrode 1006 of the light emitting element have repeated patterns in which the same shape patterns are arranged at the same interval. Therefore, such repeated patterns can be exposed by direct writing at high speed without using a photomask using the exposure apparatus in FIG. 1. Therefore, time for manufacturing a new mask is not required and low cost can be realized.

[Embodiment Mode 2]

A method for manufacturing a semiconductor device of Embodiment Mode 2 according to the present invention is described with reference to FIGS. 7A to 9D.

Figure 7A:
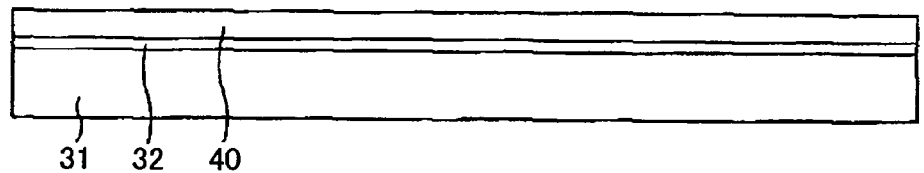
FIGS. 7A to 7D are cross sectional views describing a method for manufacturing a semiconductor device according to Embodiment Mode 2.

First, as shown in FIG. 7A, a semiconductor film 40 is formed with a thickness of 10 nm to 200 nm over a substrate 31. As the substrate 31, a glass substrate, a quartz substrate, a substrate formed of an insulating material such as alumina, a plastic substrate which is heat-resistant to the processing temperature of a subsequent step, a silicon wafer, a metal plate, or the like can be used. In this case, an insulating film 32 for preventing diffusion of impurities or the like from the substrate side, such as silicon oxide ($SiO_x$), silicon nitride ($SiN_x$), silicon oxynitride ($SiO_xN_y$) (x>y), or silicon nitride oxide ($SiN_xO_y$) (x>y) may be formed with a thickness of 10 nm to 200 nm. Alternatively, a substrate in which an insulating film such as silicon oxide or silicon nitride is formed on a surface of a metal such as stainless-steel or a semiconductor substrate may be used.

The insulating film 32 may be formed by treating the surface of the substrate 31 with high-density plasma. The high-density plasma is generated by using, for example, a microwave of 2.45 GHz, and is assumed to have an electron density of $1\times10^{11}/cm^3$ to $1\times10^{13}/cm^3$, an electron temperature of 2 eV or less, and an ion energy of 5 eV or less. Active species of such high-density plasma has low kinetic energy, and damage due to plasma is less than that in the case of a conventional plasma treatment; thus, a film with few defects can be formed. The distance from an antenna generating a microwave to the substrate 31 is preferably set to be 20 mm to 80 mm, more preferably, 20 mm to 60 mm.

The surface of the substrate 31 can be nitrided by performing the above-described high-density plasma treatment in a nitriding atmosphere, for example, in an atmosphere including nitrogen and a rare gas, an atmosphere including nitrogen, hydrogen, and a rare gas, or an atmosphere including ammonia and a rare gas. In the case of using a glass substrate, a quartz substrate, a silicon wafer, or the like as the substrate 31 and performing nitriding treatment with the above-described high-density plasma, a nitride film formed on the surface of the substrate 31 contains silicon nitride as its main component; thus, the nitride film can be used as the insulating film 32. A silicon oxide film or a silicon oxynitride film may be formed over the nitride film by plasma CVD, which may be used as the insulating film 32 including a plurality of layers.

In addition, a nitride film can be formed on the surface of the insulating film 32 formed of silicon oxide, silicon oxynitride, or the like by similarly performing nitriding treatment with high-density plasma on the surface of the insulating film 32. This nitride film can suppress diffusion of impurities from the substrate 31. In addition, the nitride film can be formed to be very thin. Therefore, influence of stress upon the semiconductor layer to be formed thereover can be reduced.

In the case of using a plastic substrate for the substrate 31, PC (polycarbonate), PES (polyethylene sulfone), PET (polyethylene terephthalate), PEN (polyethylene naphthalate), or the like which have relatively high glass transition temperature is preferably used.

The semiconductor film 40 is formed using silicon, silicon-germanium, silicon-germanium-carbon, or the like. As a method for forming the semiconductor film 40, known CVD, sputtering, coating, vapor deposition, or the like can be used. The semiconductor film 40 may be any one of an amorphous semiconductor film, a crystalline semiconductor film, or a single crystalline semiconductor film.

In the case of using a crystalline semiconductor film, the following can be used as the formation method: a method of directly forming a crystalline semiconductor film over the substrate 31, or a method of forming an amorphous semiconductor film over the substrate 31 and then crystallizing it.

Figure 8A:
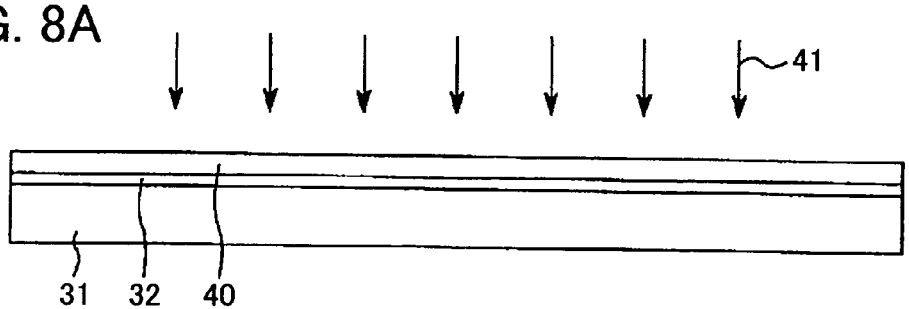
FIGS. 8A to 8D are cross sectional views describing a method for manufacturing a semiconductor device according to Embodiment Mode 2.
Figure 8B:
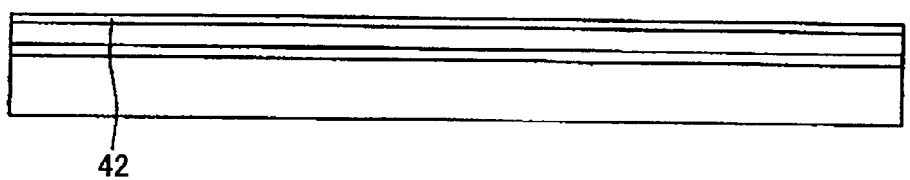
Figure 8C:
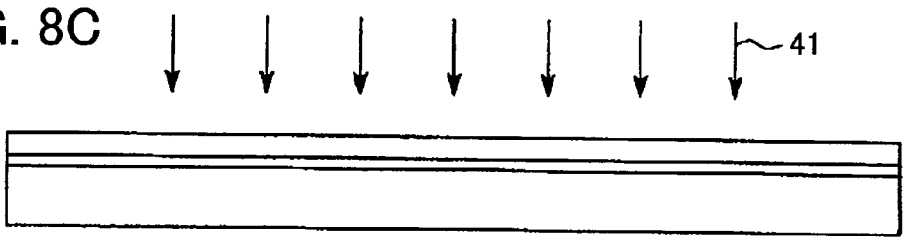

As a method of crystallizing an amorphous semiconductor film, the following can be used as the method: a method of crystallizing an amorphous semiconductor film by irradiation with a laser beam 41 (FIG. 8A); a method of crystallizing an amorphous semiconductor film by heating using an element which promotes the crystallization of the semiconductor film; or a method of crystallizing an amorphous semiconductor film by heating using an element which promotes the crystallization of the semiconductor film and then irradiating the semiconductor film with a laser beam (FIGS. 8B and 8C). Naturally, a method of thermally crystallizing an amorphous semiconductor film without using the element can be used as well. However, such a method can be applied only in the case where the substrate is a quartz substrate, a silicon wafer, or the like which can withstand the high temperature.

In the case of using laser irradiation, a continuous wave laser beam (CW laser beam) or a pulsed laser beam can be used. Here, a beam emitted from one or plural kinds of a gas laser such as an Ar laser, a Kr laser, or an excimer laser; a laser using, as a medium, single crystalline YAG, $YVO_4$, forsterite ($Mg_2SiO_4$), $YAlO_3$, or $GdVO_4$ or polycrystalline (ceramic) YAG, $Y_2O_3$, $YVO_4$, $YAlO_3$, or $GdVO_4$ doped with one or more of Nd, Yb, Cr, Ti, Ho, Er, Tm, and Ta as a dopant; a glass laser; a ruby laser; an alexandrite laser; a Ti: sapphire laser; a copper vapor laser; and a gold vapor laser can be used as the laser beam. By irradiation with a laser beam having a fundamental wave of such laser beams or one of the second to fourth harmonics, a crystal with a large grain size can be obtained. For example, the second harmonic (532 nm) or the third harmonic (355 nm) of an Nd:$YVO_4$ laser (fundamental wave of 1,064 nm) can be used. In this case, the power density of about 0.01 $MW/cm^2$ to 100 $MW/cm^2$ (preferably, 0.1 $MW/cm^2$ to 10 $MW/cm^2$) is required for the laser. The scanning rate is approximately set at about 10 cm/sec to 2,000 cm/sec to irradiate the semiconductor film.

Note that each laser using, as a medium, single crystalline YAG, $YVO_4$, forsterite ($Mg_2SiO_4$), $YAlO_3$, or $GdVO_4$ or polycrystalline (ceramic) YAG, $Y_2O_3$, $YVO_4$, $YAlO_3$, or $GdVO_4$ doped with one or more of Nd, Yb, Cr, Ti, Ho, Er, Tm, and Ta as a dopant; an Ar ion laser; and a Ti: sapphire laser is capable of continuous oscillation. Further, pulse oscillation thereof can be performed at a repetition rate of 10 MHz or more by carrying out Q switch operation or mode locking. When a laser beam is emitted at a repetition rate of 10 MHz or more, a semiconductor film is irradiated with a next pulse while the semiconductor film is melted by the laser beam and then solidified. Therefore, unlike the case of using a pulsed laser with a low repetition rate, a solid-liquid interface can be continuously moved in the semiconductor film so that crystal grains, which continuously grow in a scanning direction, can be obtained.

When ceramic (polycrystal) is used as a medium, the medium can be formed to have a free shape for a short time at low cost. When using a single crystal, a columnar medium with several mm in diameter and several tens of mm in length is usually used. In the case of using the ceramic, a medium bigger than the case of using the single crystal can be formed.

A concentration of a dopant such as Nd or Yb in a medium, which directly contributes to light emission, cannot be changed largely in either case of the single crystal or the polycrystal; therefore, there is some limitation on improvement in output of a laser by increasing the concentration of the dopant. However, in the case of a ceramic, the size of a medium can be significantly increased as compared with the case of the single crystal; thus, drastic improvement in output of a laser can be expected.

Further, in the case of a ceramic, a medium with a parallelepiped shape or a rectangular parallelepiped shape can be formed easily. In a case of using a medium having such a shape, when oscillated light is made traveled in a zigzag manner inside the medium, a path of the oscillated light can be made long. Therefore, amplification is increased and a laser beam can be oscillated at high output. Furthermore, a cross section of a laser beam emitted from a medium having such a shape has a quadrangular shape, which is advantageous when the laser beam is shaped into a linear laser beam as compared with a laser beam with a circular shape. By shaping a laser beam emitted in the above described manner using an optical system, a linear beam having a length of 1 mm or less on a lateral side and a length of several mm to several m on a longitudinal side can be easily obtained. In addition, when a medium is uniformly irradiated with excited light, energy distribution of a linear beam becomes uniform in a longitudinal direction.

When a semiconductor film is irradiated with this linear beam, the whole surface of the semiconductor film can be annealed more uniformly. In a case where uniform annealing is required from one end to the other end of the linear beam, for example, an arrangement in which slits are provided in ends of the linear beam is required thereby shielding light at a portion where energy is attenuated.

When a semiconductor film is annealed using the thus obtained linear beam having uniform intensity and an electronic device is manufactured by using this semiconductor film, characteristics of the electronic device are good and uniform.

As the method for crystallizing the semiconductor film by heating with an element which promotes the crystallization of the semiconductor film, a technique disclosed in Japanese Patent Laid-Open No. H8-78329 can be used. As to the technique in the patent application publication, an amorphous semiconductor film (also referred to as an amorphous silicon film) is doped with a metal element which promotes the crystallization of the semiconductor film, and then heat treatment is carried out so that the amorphous semiconductor film is crystallized with the doped region as a nucleus (FIG. 8B).

An amorphous semiconductor film can also be crystallized by performing irradiation with strong light instead of the heat treatment. In that case, any one of or a combination of infrared light, visible light, and ultraviolet light can be used. Typically, light emitted from a halogen lamp, a metal halide lamp, a xenon arc lamp, a carbon arc lamp, a high pressure sodium lamp, or a high pressure mercury lamp is used. The lamp light source is lighted for 1 to 60 seconds, or preferably 30 to 60 seconds, and such lighting is repeated 1 to 10 times, or preferably 2 to 6 times. The light-emission intensity of the lamp light source is arbitrary, but the semiconductor film is instantaneously heated up to about 600° C. to 1000° C. Note that if necessary, heat treatment may be performed in order to discharge the hydrogen contained in the amorphous semiconductor film 40 having an amorphous structure before the irradiation with the strong light. Alternatively, crystallization may be performed by both the heat treatment and irradiation with strong light.

Figure 8D:
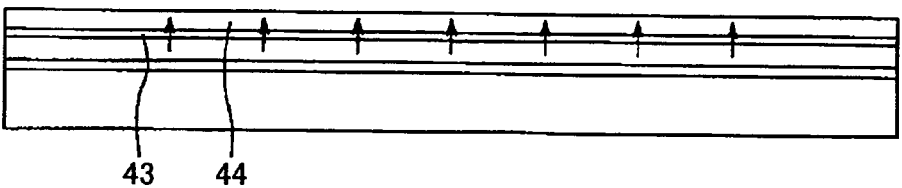

After the heat treatment, in order to increase the degree of crystallinity of the crystalline semiconductor film (rate of area occupied by crystalline components against the whole volume of the film) and to correct defects which remain in the crystalline grains, the crystalline semiconductor film may be irradiated with the laser beam 41 in the atmospheric air or an oxygen atmosphere (FIG. 8C). The laser beam may be selected from the above. Further, the metal element contained in the crystalline semiconductor film is required to be removed. The method will be described below. First, the surface of the crystalline semiconductor film is treated with a solution containing ozone (typically, ozone water), thereby forming a barrier layer 43 formed from an oxide film (called chemical oxide) on the surface of the crystalline semiconductor film to a thickness of 1 nm to 10 nm (FIG. 8D). The barrier layer 43 functions as an etching stopper when only a gettering layer is selectively removed in a subsequent step.

Then, a gettering layer containing a rare gas element is formed as a gettering site over the barrier layer 43. Here, a semiconductor film containing a rare gas element is formed as the gettering layer 44 by CVD or sputtering (FIG. 8D). When forming the gettering layer, the sputtering conditions are controlled as appropriate so that a rare gas element is added thereto. The rare gas element may be one or more of helium (He), neon (Ne), argon (Ar), krypton (Kr), or xenon (Xe).

Note that in the case of forming the gettering layer by using a source gas containing phosphorus which is an impurity element having one conductivity type or using a target including phosphorus, gettering can be performed by utilizing the coulomb force of phosphorus in addition to the gettering using the rare gas element. In gettering, a metal element (e.g., nickel) tends to move to a region having a high concentration of oxygen; therefore, the concentration of oxygen contained in the gettering layer 44 is desirably set at $5 \times 10^{18}/cm^{-3}$ or higher, for example.

Next, the crystalline semiconductor film, the barrier layer and the gettering layer are subjected to thermal treatment (e.g., heat treatment or irradiation with strong light), thereby the metal element (e.g., nickel) is gettered as shown by the arrows in FIG. 8D so that the metal element in the crystalline semiconductor film is lowered in concentration or removed.

Then, a known etching method is performed using the barrier layer 43 as an etching stopper, thereby only the gettering layer 44 is selectively removed. After that, the barrier layer 43 formed from an oxide film is removed, for example, using an etchant containing hydrofluoric acid (FIG. 7A).

Here, impurity ions may be added in consideration of threshold characteristics of a TFT to be manufactured.

Figure 7B:
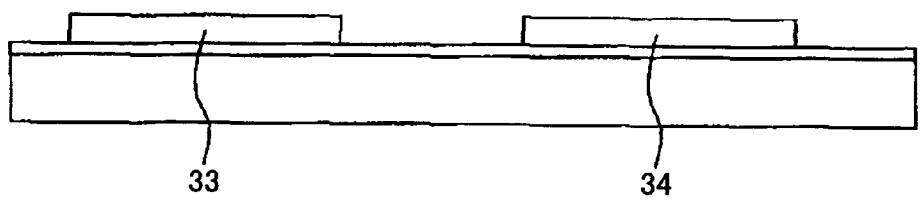

Next, the semiconductor film is formed into island-shaped semiconductor films 33 and 34 by a photolithography process (FIG. 7B). Here, a p-channel TFT is formed in the semiconductor film 33, and an n-channel TFT is formed in the semiconductor film 34. The island-shaped semiconductor films 33 and 34 have repeated patterns in which each pattern has the same shape and is arranged at the same interval. Therefore, such repeated patterns can be exposed by direct writing at high speed without using a photomask if the exposure apparatus in FIG. 1 is used in the photolithography processes. Therefore, time for manufacturing a new mask is not required and low cost can be realized.

Figure 7C:
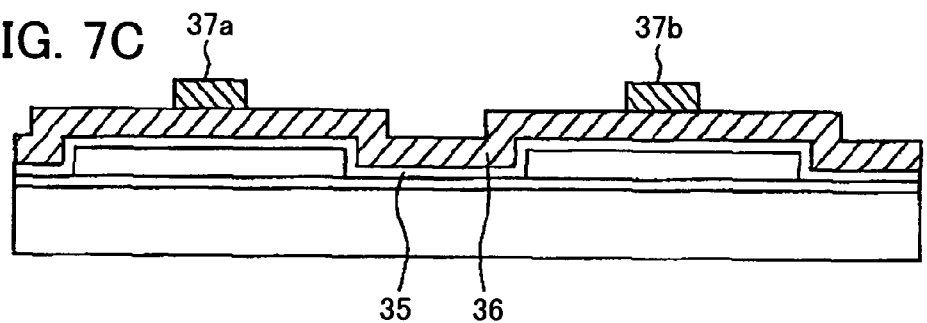

Then, after cleaning the surfaces of the semiconductor films with an etchant containing hydrofluoric acid, a gate insulating film 35 is formed to a thickness of 10 nm to 200 nm over the semiconductor films (FIG. 7C). The surface cleaning and the formation of the gate insulating film 35 may be continuously carried out without exposure to the atmosphere. The gate insulating film 35 is formed from an insulating film containing silicon as a main component, for example, a silicon oxide film, a silicon nitride film, a silicon oxynitride film, a silicon nitride oxide film, or the like. Further, the gate insulating film may be a single layer or a layered film.

Next, after cleaning the surface of the gate insulating film 35, a conductive film 36 forming a gate electrode is formed to a thickness of 100 nm to 500 nm over the whole surface including the surface of the gate insulating film 35 (FIG. 7C). The conductive film 36 may be formed of an element selected from tantalum (Ta), tungsten (W), titanium (Ti), molybdenum (Mo), or aluminum (Al); or an alloy material or a compound material containing one of the above elements as a main component. Alternatively, a semiconductor film typified by a polycrystalline silicon film doped with an impurity element such as phosphorus (P) or the like may be used. Further, the conductive film 36 may have a single layer structure or a layered structure including two or more layers.

Figure 7D:
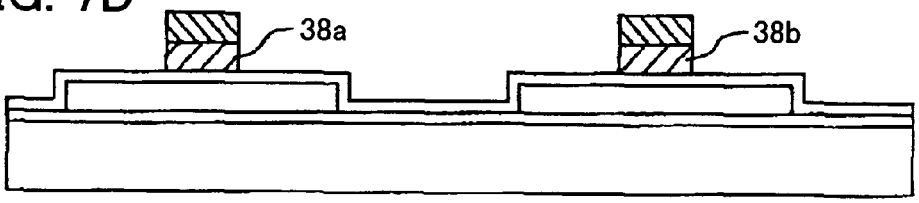

The surface of the conductive film 36 is coated with a photoresist film, and this photoresist film is exposed and developed, thereby forming a first resist mask 37a and a second resist mask 37b to a thickness of 1.0 μm to 1.5 μm. The conductive film 36 is etched using the resist masks 37a and 37b, thereby forming gate electrodes 38a and 38b over the gate insulating film 35 (FIG. 7D). Note that the resist masks of this embodiment mode can be formed of a positive type resist containing novolac resin and a naphthoquinone diazide compound. Moreover, the gate electrodes 38a and 38b have the repeated patterns in which each pattern has the same shape and is arranged at the same interval. Therefore, such repeated patterns can be exposed by direct writing at high speed without using a photomask if the exposure apparatus in FIG. 1 is used. Therefore, time for manufacturing a new mask is not required and low cost can be realized.

Further, a wire such as a gate wire can be formed from the same material as the gate electrodes 38a and 38b. Here, the gate electrode or the wire is preferably led so as to have a round corner when seen from a direction perpendicular to the substrate 31. By making the corners round, dust or the like can be prevented from remaining at the corners of the wire; thus, the number of defects generated due to dust can be reduced and yield can be improved.

Figure 9A:
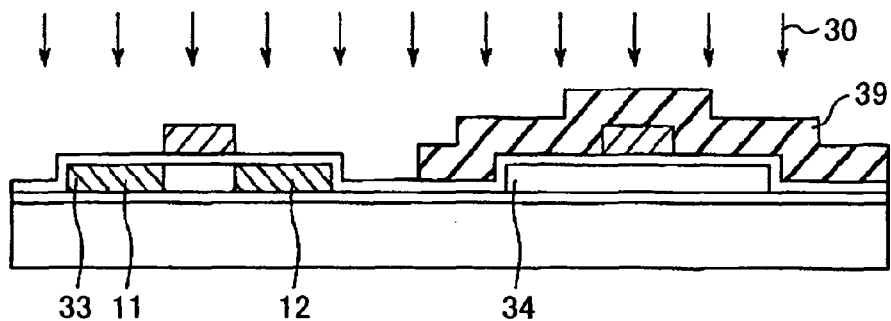
FIGS. 9A to 9D are cross sectional views describing a method for manufacturing a semiconductor device according to Embodiment Mode 2.

Next, after removing the first resist mask 37a and the second resist mask 37b by a method such as ashing, coating with a photoresist film is carried out, and the photoresist film is exposed and developed, thereby forming a third resist mask 39 to a thickness of 1.0 μm to 1.5 μm covering the semiconductor film 34, the gate electrode 38b, and the second resist mask 37b (FIG. 9A).

The semiconductor film 33 is doped with p-type impurity ions 30 (B ions) using the third resist mask 39, and the gate electrodes 38a and 38b as masks, thereby forming a source region 11 and a drain region 12. The B ions accelerate at 50 kV to 100 kV, and concentration of the B ions is $1.0\times10^{19}$ $cm^{-3}$ to $1.0\times10^{21}$ $cm^{-3}$.

Figure 9B:
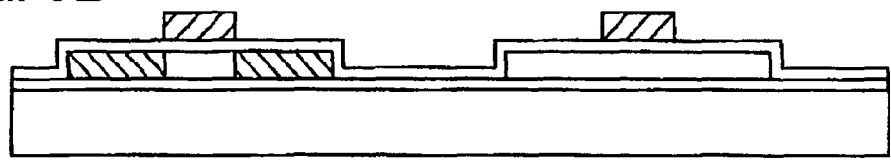

Next, the third resist mask 39 is removed by a method such as ashing (FIG. 9B).

Figure 9C:
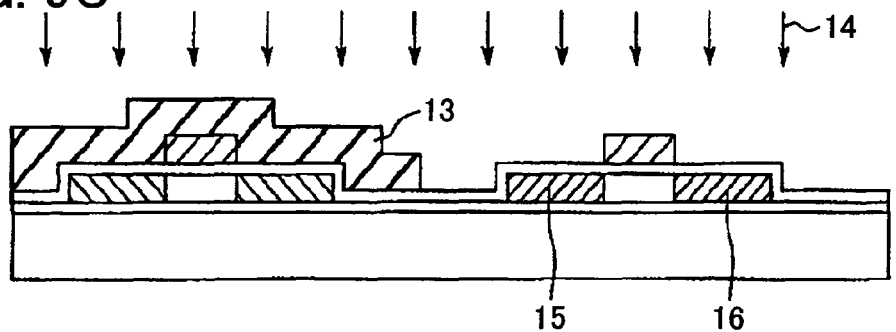

Then, coating with a photoresist film is carried out, and the photoresist film is exposed and developed, so that a fourth resist mask 13 is formed to a thickness of 1.0 μm to 1.5 μm covering the semiconductor film 33, and the gate electrode 38a (FIG. 9C).

The n-type impurity ions 14 (phosphorus ions, arsenic ions, or the like) are introduced into the semiconductor film 34 using the fourth resist mask 13, the gate electrodes 38a and 38b as masks, thereby forming a source region 15 and a drain region 16 (FIG. 9C). The n-type impurity ions accelerate at 30 kV to 80 kV, and concentration of the n-type impurity is $1.0\times10^{19}$ $cm^{-3}$ to $1.0\times10^{21}$ $cm^{-3}$.

Here, heat treatment, irradiation with laser light or strong light, RTA or the like may be performed to activate the source regions and the drain regions.

Thus the semiconductor film 33 becomes a p-channel TFT, and the semiconductor film 34 becomes an n-channel TFT. Here, p-type impurity ions are added first and n-type impurity ions are added afterwards; however, the order may be reversed. In that case, the accelerating voltage or acceleration energy of the p-type impurity ions is preferably lower than the accelerating voltage or acceleration energy of the n-type impurity ions. As the accelerating voltage, the voltage described above can be used.

Further, the dose of p-type impurity ions is preferably less than the dose of the n-type impurity ions.

Next, an interlayer insulating film 17 is formed over the whole surface including the surfaces of the gate insulating film 35 and the gate electrodes 38a and 38b, and hydrogenation is carried out. As the interlayer insulating film 17, a silicon nitride film, a silicon oxide film, a silicon oxynitride film, or a silicon nitride oxide film can be used.

Then, a resist mask is formed over the interlayer insulating film 17, and the interlayer insulating film 17 is etched using the resist mask; thus, contact holes located above each of the source regions 11 and 15 and each of the drain regions 12 and 16 are formed.

Figure 9D:
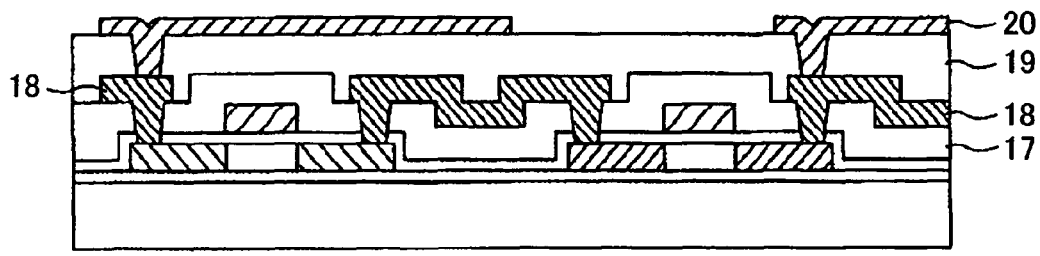

After the resist mask is removed and a conductive film is formed, etching is carried out using another resist mask, thereby forming an electrode or a wire 18 (a source wire and a drain wire of the TFTs, or a current supply wire of the TFTs) (FIG. 9D). Note that, in this embodiment mode, the electrode and the wire are integrated; however, the electrode and the wire may be separately formed and connected electrically. As the conductive film, a layered film of TiN, Al, and TiN, or an Al alloy film can be used.

Here, the electrode or the wire is preferably led so as to have a round corner when seen from a direction perpendicular to the substrate 31. By making the corners round, dust or the like can be prevented from remaining at the corners of the wire; thus, the number of defects generated due to dust can be reduced and the yield can be improved. A mask manufactured by exposure and development using a photosensitive resist is used for patterning. Moreover, the electrode and the wire have the repeated patterns in which each pattern has the same shape and is arranged at the same interval to each other. Therefore, such repeated patterns can be exposed by direct writing at high speed without using a photomask if the exposure apparatus in FIG. 1 is used. Accordingly, time for manufacturing a new mask is not required, and low cost can be realized.

A planarizing film to be a second interlayer insulating film 19 is formed. The planarizing film is formed using a light-transmitting inorganic material (silicon oxide, silicon nitride, silicon nitride containing oxygen, or the like), a photosensitive or non-photosensitive organic material (polyimide, acrylic, polyamide, polyimide amide, a resist, or benzocyclobutene), or a stack thereof. Alternatively, the planarizing film may be formed using a light-transmitting film such as an insulating film formed from a $SiO_x$ film containing an alkyl group obtained by a coating method. For example, an insulating film formed of silica glass, alkyl siloxane polymers, alkylsilsesquioxane polymers, hydrogen silsesquioxane polymers, hydrogen alkylsilsesquioxane polymers, or the like can be used. As examples of siloxane-based polymers, there are coating insulating film materials such as PSB-K1 and PSB-K31 (product of Toray industries, Inc.) and a coating insulating film material such as ZRS-5PH (product of Catalysts & Chemicals Industries Co., Ltd.). The second interlayer insulating film may be a single layer or a multi-layer.

Contact holes are formed in the second interlayer insulating film 19 using another resist mask. Moreover, the contact holes have the repeated patterns in which each pattern has the same shape and is arranged at the same interval. Therefore, such repeated patterns can be exposed by direct writing at high speed without using a photomask if the exposure apparatus in FIG. 1 is used.

Next, a conductive film 20 is formed. The conductive film can be formed from a transparent conductive film using indium tin oxide containing a Si element, IZO (Indium Zinc Oxide) in which 2 to 20 wt % of zinc oxide (ZnO) is mixed with indium oxide, or the like other than indium tin oxide (ITO). After that, the conductive film is patterned using another resist mask to form a transparent electrode (FIG. 9D). Note that the conductive film is not required to be transparent if it is not used for a display device. Note that the transparent film has the repeated patterns in which each pattern has the same shape and is arranged at the same interval. Therefore, such repeated patterns can be exposed by direct writing at high speed without using a photomask if the exposure apparatus in FIG. 1 is used.

[Embodiment Mode 3]

Figure 10A:
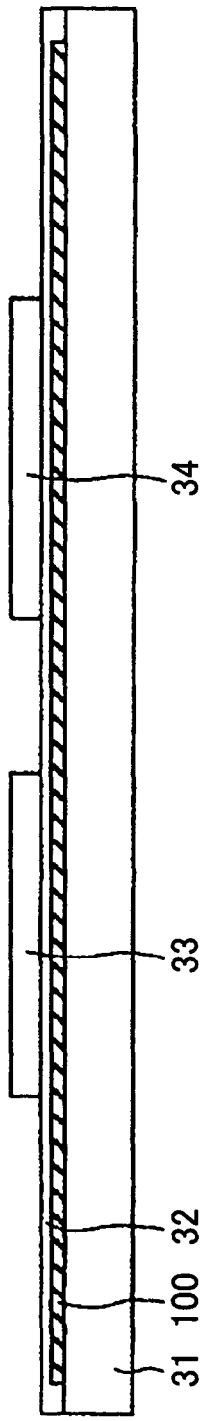
FIGS. 10A and 10B are cross sectional views describing a method for manufacturing a semiconductor device according to Embodiment Mode 3.

Here, a method for manufacturing a semiconductor device which is capable of data transmission/reception without contact, for example, an IC tag or an IC chip using the present invention will be described. Note that, parts that are the same as those in the above embodiment modes are denoted by the same reference numerals. First, a release layer 100 is formed over one surface of the substrate 31 (FIG. 10A). The substrate 31 is formed using a glass substrate, a quartz substrate, a metal substrate or a stainless-steel substrate over one surface of which an insulating layer is formed, a plastic substrate which is resistant to the processing temperature of the present step, or the like. There is no limitation on the size or the shape of a substrate such as the substrate 31. When the substrate 31 has a rectangular shape with a length of one meter or longer on a side, the productivity can be drastically improved. Such an advantage is far superior to the case where a wireless chip is taken from a circular silicon substrate. In addition, a thin film integrated circuit formed over the substrate 31 is separated from the substrate 31 later. In other words, the wireless chip provided by the invention does not have the substrate 31. Accordingly, the substrate 31 from which a thin film integrated circuit is separated can be reused a number of times. In this manner, if the substrate 31 is reused, cost reduction can be achieved. The substrate 31 to be reused is desirably a quartz substrate.

Note that in this embodiment mode, the release layer 100 is selectively provided by forming a thin film over one surface of the substrate 31, and patterning it by photolithography.

The release layer 100 is formed in a single layer or a stack by a known method (e.g., sputtering or plasma CVD) using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), lead (Pd), osmium (Os), iridium (Ir), or silicon (Si), or an alloy material or compound material containing such elements as a main component. A layer containing silicon may have any of an amorphous structure, a microcrystalline structure and a polycrystalline structure.

If the release layer 100 has a single-layer structure, it is preferably formed using a tungsten layer, a molybdenum layer, or a layer containing a mixture of tungsten and molybdenum. Alternatively, the release layer 100 is formed using a layer containing tungsten oxide or a layer containing a tungsten oxynitride; a layer containing molybdenum oxide or a layer containing molybdenum oxynitride; or a layer containing oxide or oxynitride of a mixture of tungsten and molybdenum. Note that the mixture of tungsten and molybdenum corresponds, for example, to an alloy of tungsten and molybdenum.

If the release layer 100 has a layered structure, preferably, a first layer thereof is formed of a tungsten layer, a molybdenum layer, or a layer containing a mixture of tungsten and molybdenum, and a second layer thereof is formed of oxide, nitride, oxynitride or nitride oxide of tungsten, molybdenum, or a mixture of tungsten and molybdenum.

In the case where the release layer 100 is formed with a layered structure of a layer containing tungsten and a layer containing tungsten oxide, the layer containing tungsten may be formed first and a silicon oxide layer may be formed thereon so that a tungsten oxide layer is formed at the interface between the tungsten layer and the silicon oxide layer. This also applies to the case of forming a layer containing nitride, oxynitride or nitride oxide of tungsten. For example, after forming a tungsten layer, a silicon nitride layer, a silicon oxynitride layer, or a silicon nitride oxide layer is formed thereover. Note that the silicon oxide layer, the silicon oxynitride layer, the silicon nitride oxide layer or the like which is formed over the tungsten layer serves as an insulating layer which becomes a base afterwards.

The tungsten oxide is denoted by $WO_x$, where x is in the range of 2 to 3. There are cases where x is 2 (the oxide is $WO_2$), x is 2.5 (the oxide is $W_2O_5$), x is 2.75 (the oxide is $W_4O_{11}$), x is 3 (the oxide is $WO_3$), and the like. In forming the tungsten oxide, the x value is not specifically limited to a certain value, and it may be determined based on the etching rate or the like. Note that a layer containing tungsten oxide which is formed by sputtering in an oxygen atmosphere has the best etching rate ($WO_x$, $0<x<3$). Thus, in order to reduce manufacturing time, the release layer is preferably formed using a layer containing tungsten oxide by sputtering in an oxygen atmosphere.

Note that the release layer 100 is formed so as to contact the substrate 31 in the aforementioned step; however, the invention is not limited thereto. For example, after forming an insulating film to be a base so as to contact the substrate 31, the release layer 100 may be formed so as to contact the insulating film.

Then, an insulating film 32 is formed to be a base so as to cover the release layer 100. The insulating film 32 is formed in a single layer or a stack by a known method (e.g., sputtering or plasma CVD) using a layer containing silicon oxide or a layer containing silicon nitride. The silicon oxide material is a substance containing silicon (Si) and oxygen (O), which corresponds to silicon oxide, silicon oxynitride, silicon nitride oxide, or the like. The silicon nitride material is a substance containing silicon and nitrogen (N), which corresponds to silicon nitride, silicon oxynitride, silicon nitride oxide, or the like.

Figure 10B:
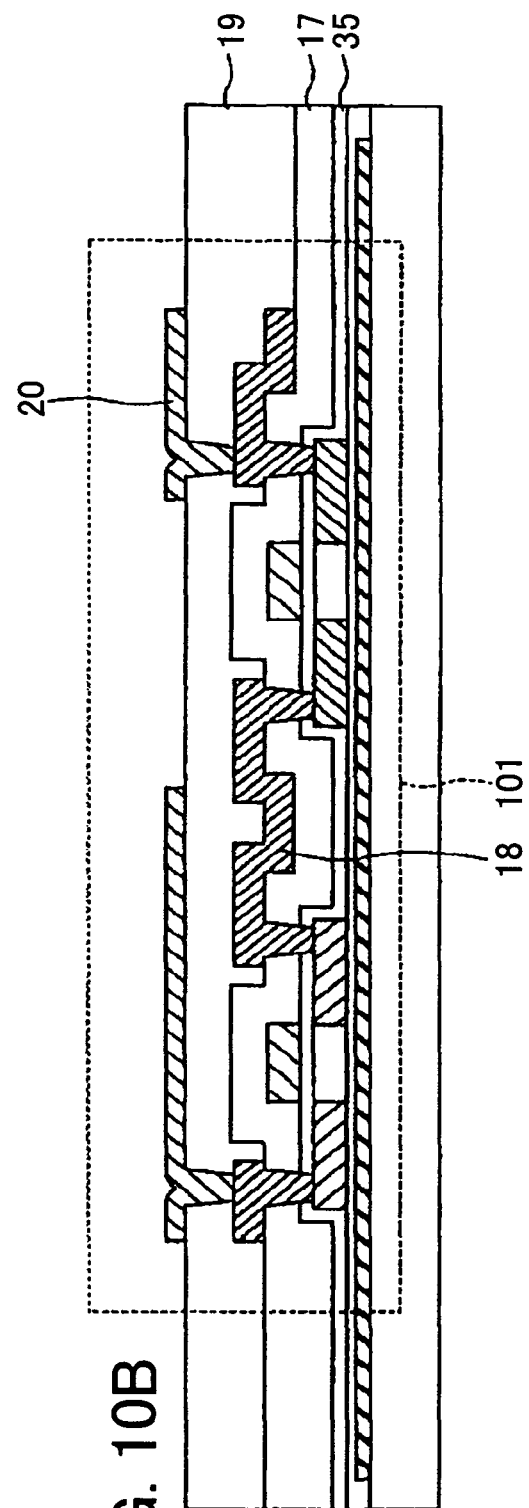

Then, after an amorphous silicon film is formed over the insulating film 32, a p-channel TFT and an n-channel TFT are manufactured. The TFTs can be manufactured by using a method shown in the above embodiment modes; therefore, the description is omitted here. When manufacturing the TFT, direct writing can be performed at high speed by using the exposure apparatus shown in FIG. 1. FIG. 10B shows the one in which steps up to the formation of a TFT has done. As compared to FIG. 9D, difference is that a release layer is provided under the insulating film over the substrate.

A conductive film 20 formed in the above embodiment mode functions as an antenna. Unlike the above embodiment mode, the conductive film 20 is formed in a single layer or a stack using an element selected from aluminum (Al), titanium (Ti), silver (Ag), or copper (Cu) or an alloy material or a compound material containing such an element as a main component. For example, the conductive film 20 may be formed by stacking a barrier layer and an aluminum layer in this order, or a barrier layer, an aluminum layer, and a barrier layer in this order. The barrier layer corresponds to titanium, titanium nitride, molybdenum, molybdenum nitride, or the like.

Next, although not shown here, a protective layer may be formed by a known method so as to cover a thin film integrated circuit 101. The protective layer corresponds to a layer containing carbon such as DLC (Diamond Like Carbon), a layer containing silicon nitride, a layer containing silicon nitride oxide, or the like.

Figure 11A:
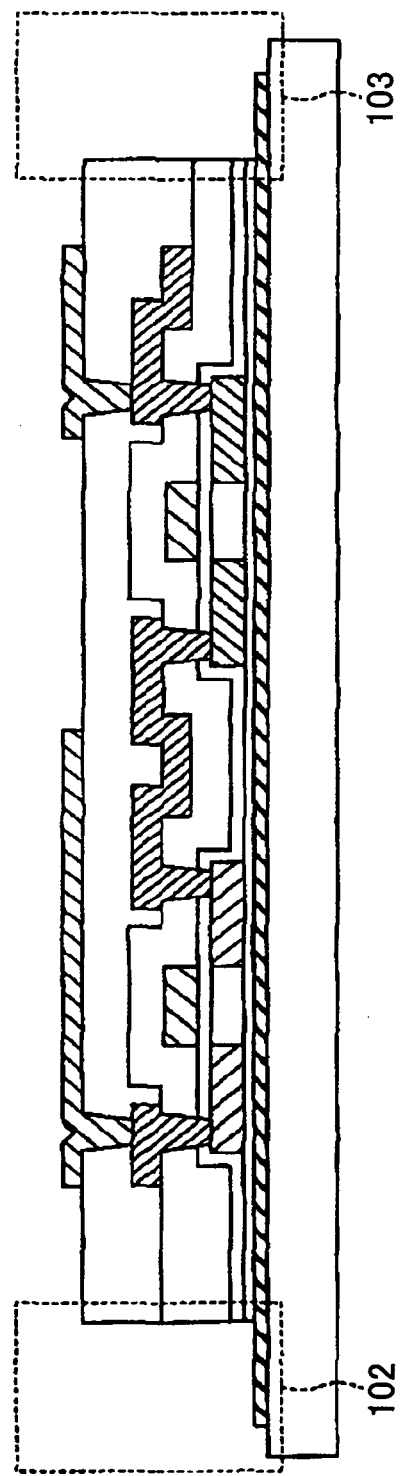
FIGS. 11A and 11B are cross sectional views describing a method for manufacturing a semiconductor device according to Embodiment Mode 3.

Then, the insulating layers 32, 35, 17, and 19 are etched by photolithography so as to expose the release layer 100, thereby forming openings 102 and 103 (FIG. 11A).

Figure 11B:
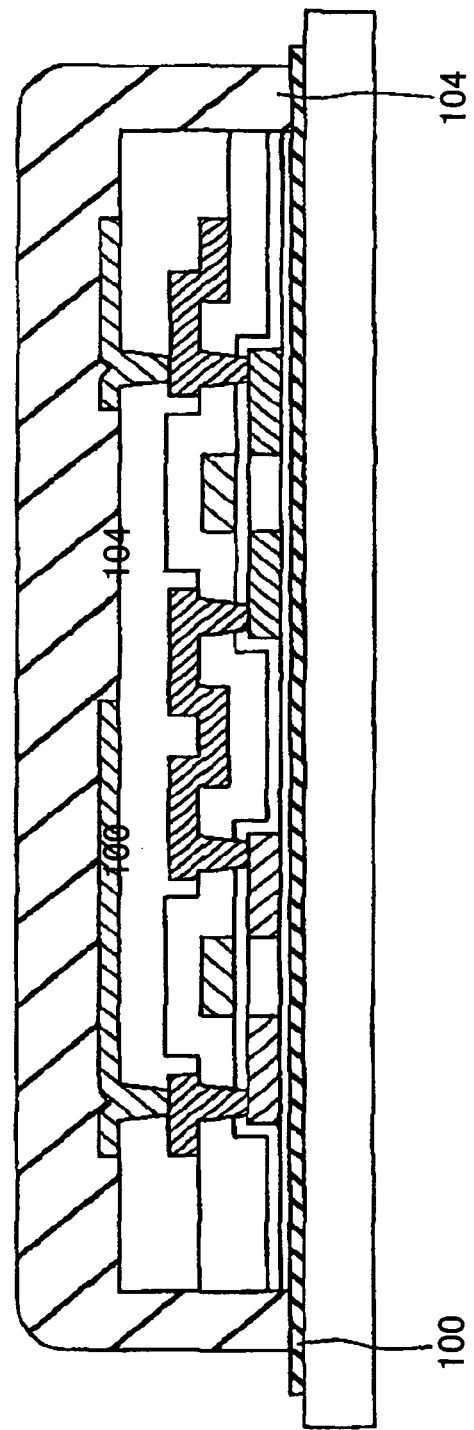

Then, an insulating film 104 is formed by a known method (e.g., an SOG method or droplet discharge method) so as to cover the thin film integrated circuit 101 (FIG. 11B). The insulating film 104 is formed using an organic material, preferably an epoxy resin. The insulating film 104 is formed to prevent the thin film integrated circuit 101 from shattering. Since the thin film integrated circuit 101 is small, thin, and lightweight, it easily shatters after the removal of the release layer as it is not in close contact with the substrate). However, by forming the insulating layer 104 around the thin film integrated circuit 101, the weight of the thin film integrated circuit 101 can be increased, and thus the shattering thereof from the substrate 31 can be prevented. The thin film integrated circuit 101 itself is thin and lightweight; however, by forming the insulating layer 104, the thin film integrated circuit 101 can be prevented from being rolled up and have a certain degree of strength. Note that in the structure shown, the insulating film 104 is formed over the top surface and side surfaces of the thin film integrated circuit 101; however, the invention is not limited to this structure, and the insulating film 104 may be formed only over the top surface of the thin film integrated circuit 101. In addition, in the above description, after the step of forming the openings 102 and 103, the step of forming the insulating film 104 is carried out; however, the invention is not limited to this order. For example, after the step of forming the insulating film 104 over the interlayer insulating film 19, the step of forming the openings may be performed by etching the plurality of insulating films. In the case of this order of the steps, the insulating film 104 is formed over only the top surface of the thin film integrated circuit 101.

Figure 12A:
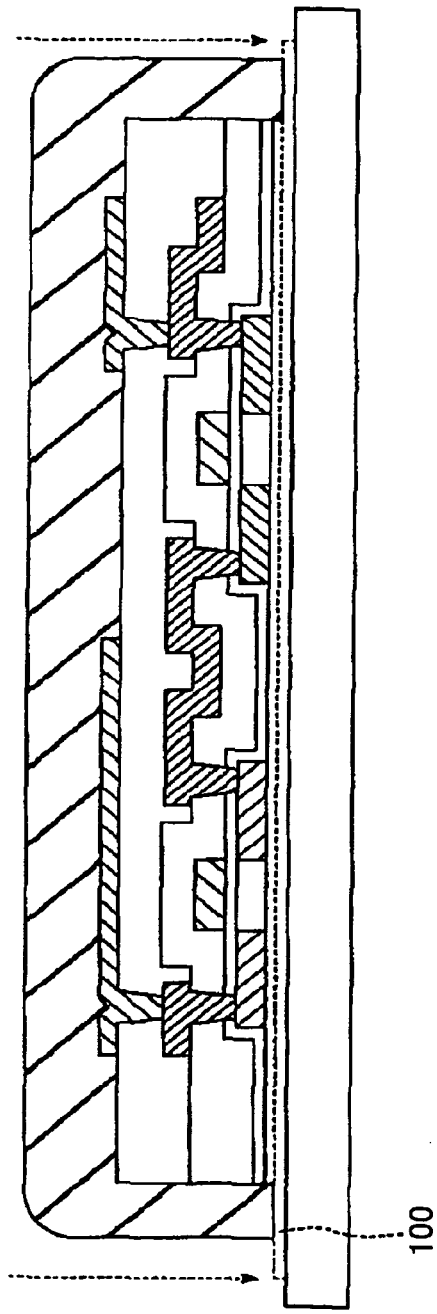
FIGS. 12A and 12B are cross sectional views describing a method for manufacturing a semiconductor device according to Embodiment Mode 3.

Then, an etchant is added into the openings 102 and 103, thereby removing the release layer 100 (FIG. 12A). As the etchant, a gas or a solution containing halogen fluoride or a halogenated compound is used. For example, chlorine trifluoride ($ClF_3$) is used as a gas containing halogen fluoride. Thus, the thin film integrated circuit 101 is separated from the substrate 31.

Figure 12B:
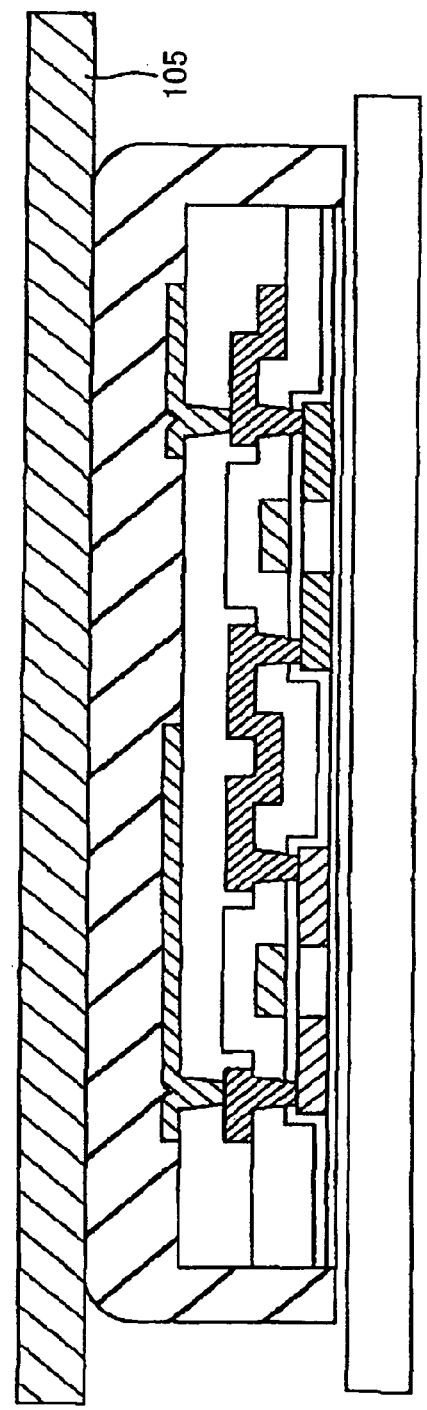

Next, one surface of the thin film integrated circuit 101 is stuck to a first base 105 so that the thin film integrated circuit 101 is completely separated from the substrate 31 (FIG. 12B).

Figure 13:
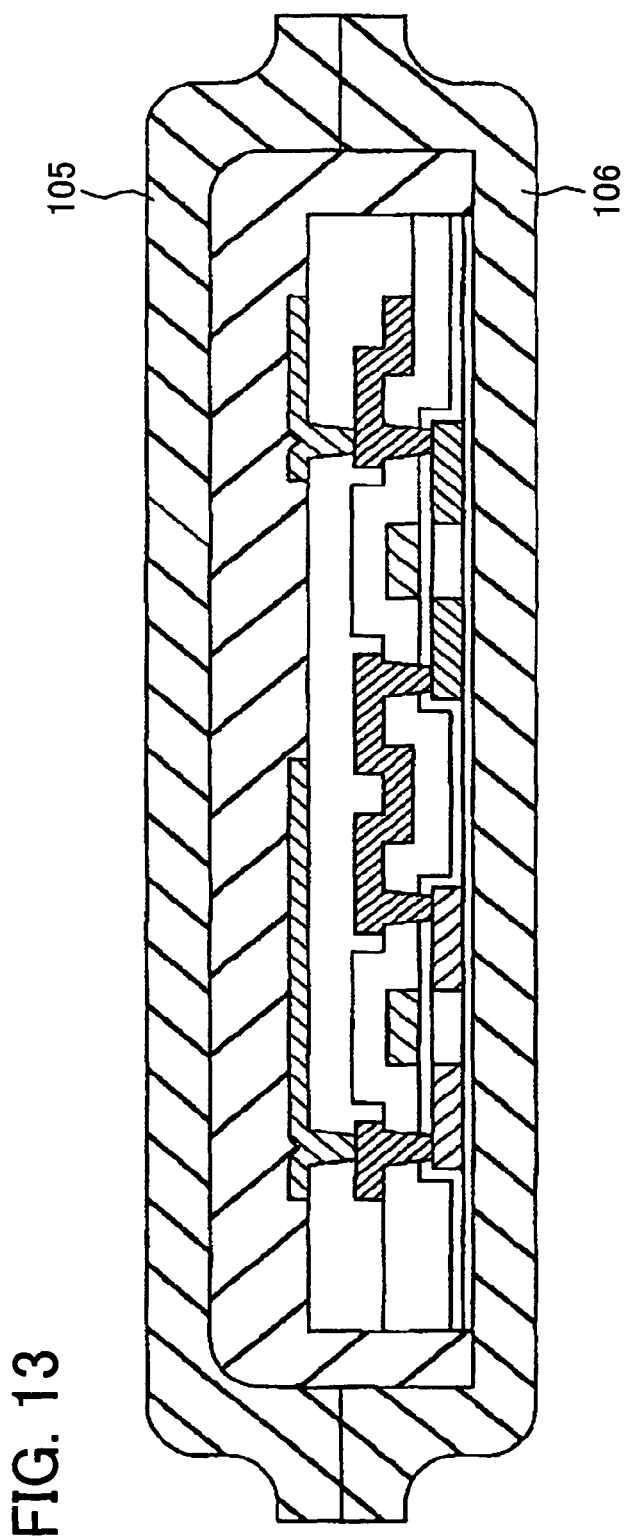
FIG. 13 is a cross sectional view describing a method for manufacturing a semiconductor device according to Embodiment Mode 3.

Subsequently, the opposite surface of the thin film integrated circuit 101 is stuck to a second base 106 so that the thin film integrated circuit 101 is sealed with the first base 105 and the second base 106 (FIG. 13). Thus, an IC tag is completed in which the thin film integrated circuit 101 is sealed by the first base 105 and the second base 106.

The first base 105 and the second base 106 each corresponds to a layered film (formed of polypropylene, polyester, vinyl, polyvinyl fluoride, polyvinyl chloride, or the like); paper formed of a fibrous material; a layered film of a base film (e.g., polyester, polyamide, an inorganic vapor-deposited film, or paper) and an adhesive synthetic resin film (e.g., acrylic synthetic resin or epoxy synthetic resin); or the like. The layered film is stacked and attached on an object. When stacking and attaching a layered film over an object, an adhesive layer provided on the outmost surface of the layered film or a layer (which is not an adhesive layer) provided on the outmost layer is melted by heat treatment, and pressure is applied thereto for attachment.

Each surface of the first base 105 and the second base 106 may be provided with an adhesive layer or no adhesive layer. The adhesive layer corresponds to a layer containing an adhesive agent such as a thermosetting resin, an ultraviolet-curable resin, an epoxy resin adhesive or a resin additive.

Next, application examples of a semiconductor device which can transmit and receive data without contact will be hereinafter described with reference to drawings. The semiconductor device which can transmit and receive data without contact is generally referred to as an RFID (Radio Frequency Identification) tag, an ID tag, an IC tag, an IC chip, an RF (Radio Frequency) tag, a wireless tag, an electronic tag, or a wireless chip in accordance with a usage mode.

Figure 14A:
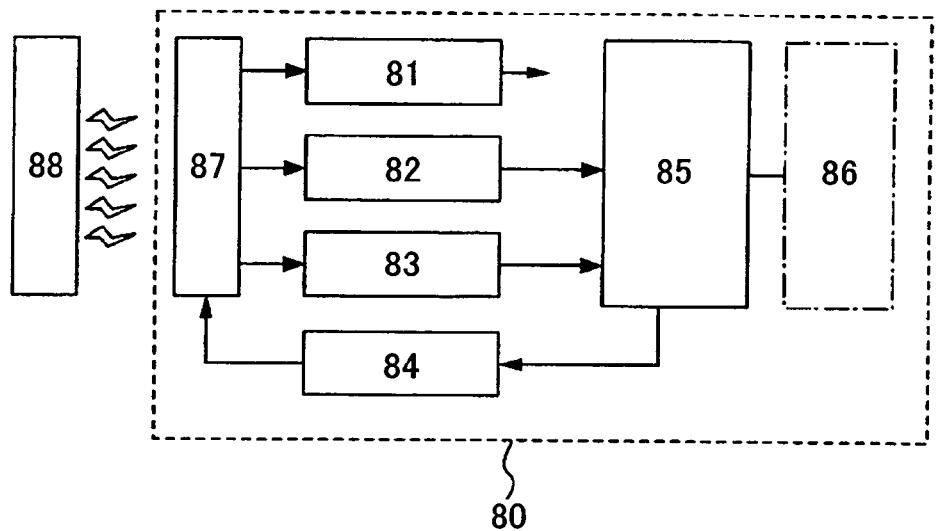
FIG. 14A is a block diagram describing an RFID tag of Embodiment Mode 3.

An RFID tag 80 has a function of transmitting and receiving data without contact, and includes a power supply circuit 81, a clock generation circuit 82, a data demodulation circuit 83, a data modulation circuit 84, a control circuit 85 for controlling other circuits, a memory circuit 86, and an antenna 87 (FIG. 14A). Further, the RFID tag may include a plurality of memory circuits rather than one memory circuit. An SRAM, a flash memory, a ROM, or an FeRAM, or a circuit, which uses an organic compound layer described in the above described embodiment modes in a memory element portion, and the like can be used.

Signals sent from a reader/writer 88 as radio waves are modulated into alternating-current electric signals in the antenna 87 by electromagnetic induction. Power supply voltage is generated in the power supply circuit 81 by using the alternating-current electric signals, and supplied to each circuit using a power supply line. The clock generation circuit 82 generates various kinds of clock signals based on the alternating-current electric signals inputted from the antenna 87, and supplies the various kinds of clock signals to the control circuit 85. The demodulation circuit 83 demodulates the alternating-current electric signals and supplies the demodulated alternating-current electric signals to the control circuit 85. In the control circuit 85, various kinds of arithmetic processing are performed in accordance with the inputted signals. Programs, data and the like that are used in the control circuit 85 are stored in the memory circuit 86. In addition, the memory circuit 86 can also be used as a work area in the arithmetic processings. Then, data is transmitted to the modulation circuit 84 from the control circuit 85, and load modulation can be provided to the antenna 87 from the modulation circuit 84 in accordance with the data. Consequently, the reader/writer 88 receives load modulation applied to the antenna 87 via radio waves so that the reader/writer can read the data.

In addition, the RFID tag may be of a type that power supply voltage is supplied to each circuit via radio waves without using a power source (a battery), or another type that power supply voltage is supplied to each circuit by utilizing both radio waves and a power source (a battery).

A foldable RFID tag can be manufactured using such a structure described in the above embodiment modes, and thus, such an RFID tag can be attached to an object having a curved surface.

Figure 14B:
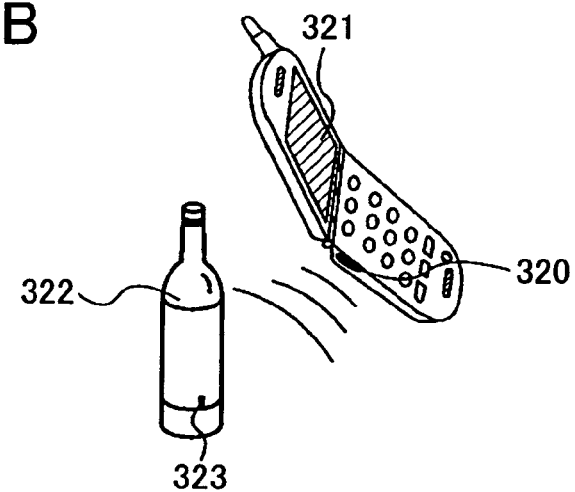
FIGS. 14B and 14C are perspective views showing one example of a usage pattern of an RFID tag.
Figure 14C:
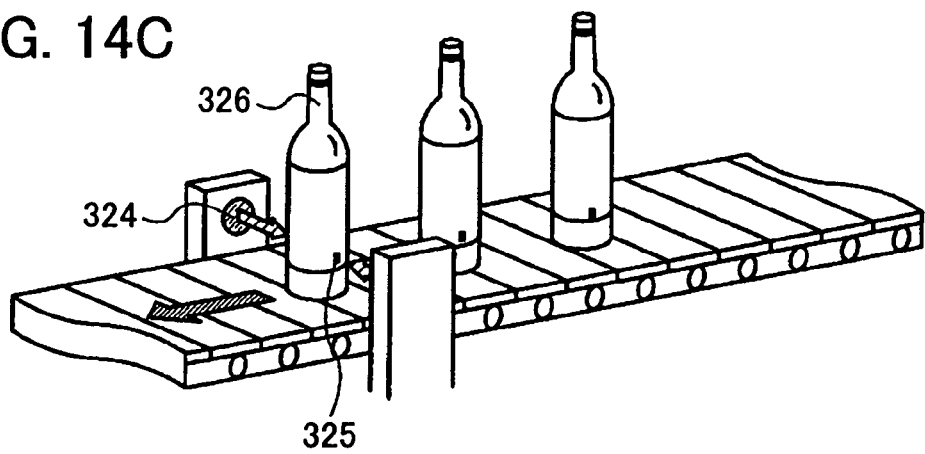
Figure 15A:
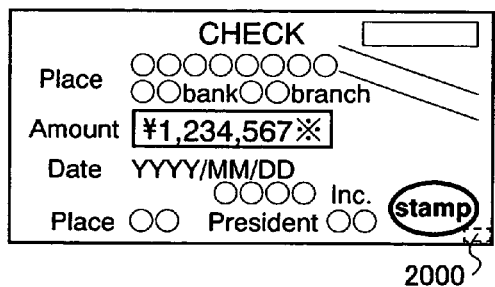
FIGS. 15A to 15H are perspective views showing an example a usage pattern of an RFID tag of Embodiment Mode 3.
Figure 15B:
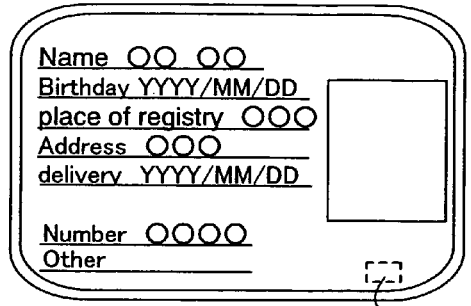
Figure 15C:
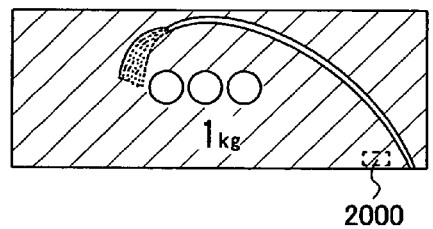
Figure 15D:
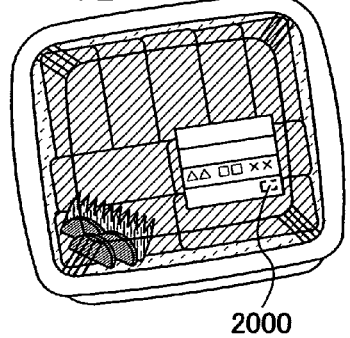
Figure 15E:
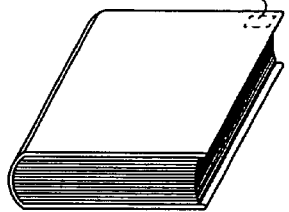
Figure 15F:
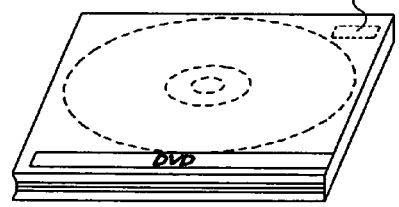
Figure 15G:
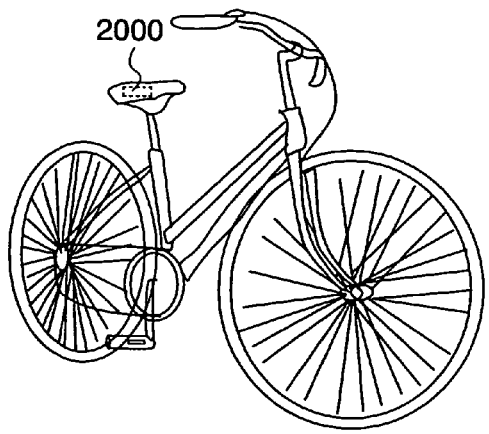
Figure 15H:
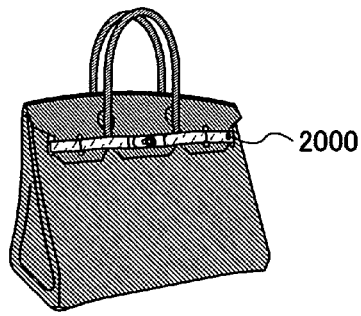

Next, an example of a usage mode of a flexible RFID tag will be described. A reader/writer 320 is provided on a side surface of a portable terminal which includes a display area 321. An RFID tag 323 is provided on a side surface of a product 322 (FIG. 14B). When the reader/writer 320 is held over the RFID tag 323 included in the product 322, information about the product such as a raw material, a place of origin, test results in each production process, history of distribution process, and a description of a commodity, is displayed on the display area 321. In addition, when a commodity 326 is conveyed by a belt conveyor, the inspection of the commodity 326 can be carried out using a reader/writer 324 and an RFID tag 325 provided on the commodity 326 (FIG. 14C). In this way, by utilizing an RFID tag for a system, information can be easily obtained, thereby realizing high performance and high added value. As described in the above embodiment modes, even when an RFID tag is attached to an article having a curved surface, a thin film transistor or the like included in the RFID tag can be prevented from being damaged, so that a highly reliable RFID tag can be provided.

Other than those described above, the application range of a flexible RFID tag is so wide that it may be applied to any product in order that the history of the object is revealed without contact and utilized in production, management and the like. For example, such an RFID tag may be incorporated in bills, coins, securities, certificates, bearer bonds, containers for packages, books, recording media, personal belongings, vehicles, foods, clothes, healthcare items, livingware, medicals, electronic devices, and the like. Examples of these products are described with reference to FIGS. 15A to 15H.

The bills and coins include currency in the market and include a note that is current as money in a specific area (cash voucher), memorial coins, and the like. The securities include a check, a certificate, a promissory note, and the like (see FIG. 15A). The certificates include a driver's license, a resident card, and the like (see FIG. 15B). The bearer bonds include a stamp, a rice coupon, various gift coupons, and the like (see FIG. 15C). The containers for packages include paper for packing a box lunch or the like, a plastic bottle, and the like (see FIG. 15D). The books include a document and the like (see FIG. 15E). The recording media include DVD software, a video tape, and the like (see FIG. 15F). The vehicles include a wheeled vehicle such as a bicycle, a vessel, and the like (see FIG. 15G). The personal belongings include a bag, glasses, and the like (see FIG. 15H). The foods include food items, beverages, and the like. The clothes include clothing, footwear, and the like. The healthcare items include a medical device, a health appliance, and the like. The livingware includes furniture, a lighting apparatus, and the like. The medicals include a medicine, an agricultural chemical, and the like. The electronic devices include a liquid crystal display device, an EL display device, a television set (television receiver, thin television receiver), a cellular phone, and the like.

As described above, in this embodiment mode, a semiconductor device such as an IC tag and an RFID tag can be manufactured by using a TFT to which the present invention is applied. Accordingly, manufacturing time and manufacturing cost can be reduced, thereby realizing low cost.

Thus, when an RFID tag is incorporated in containers for packages, recording media, personal belongings, foods, clothes, livingware, electronic devices, and the like, efficiency of inspection system, rental system, and the like can be increased. An RFID tag also prevents vehicles from being forged or stolen. In addition, when an RFID chip is implanted into creatures such as animals, each creature can be identified easily. For example, when an RFID tag provided with a sensor is implanted into creatures such as domestic animals, not only the year of birth, sex, breed and the like but also the health condition such as the current body temperature can be easily managed.

Note that, this embodiment mode can be freely combined with any of the above embodiment modes. In other words, the present invention includes any combination of the configuration shown in the above embodiment modes and the configuration shown in this embodiment mode.

[Embodiment Mode 4]

An example of manufacturing a liquid crystal display device (LCD) using the invention is shown.

The manufacturing method of a display device described here is a method of simultaneously manufacturing a pixel portion including a pixel TFT and a TFT of a driver circuit area which is provided around the pixel portion. Note that a CMOS circuit as a base unit is shown as a driver circuit to simplify the description.

Figure 16:
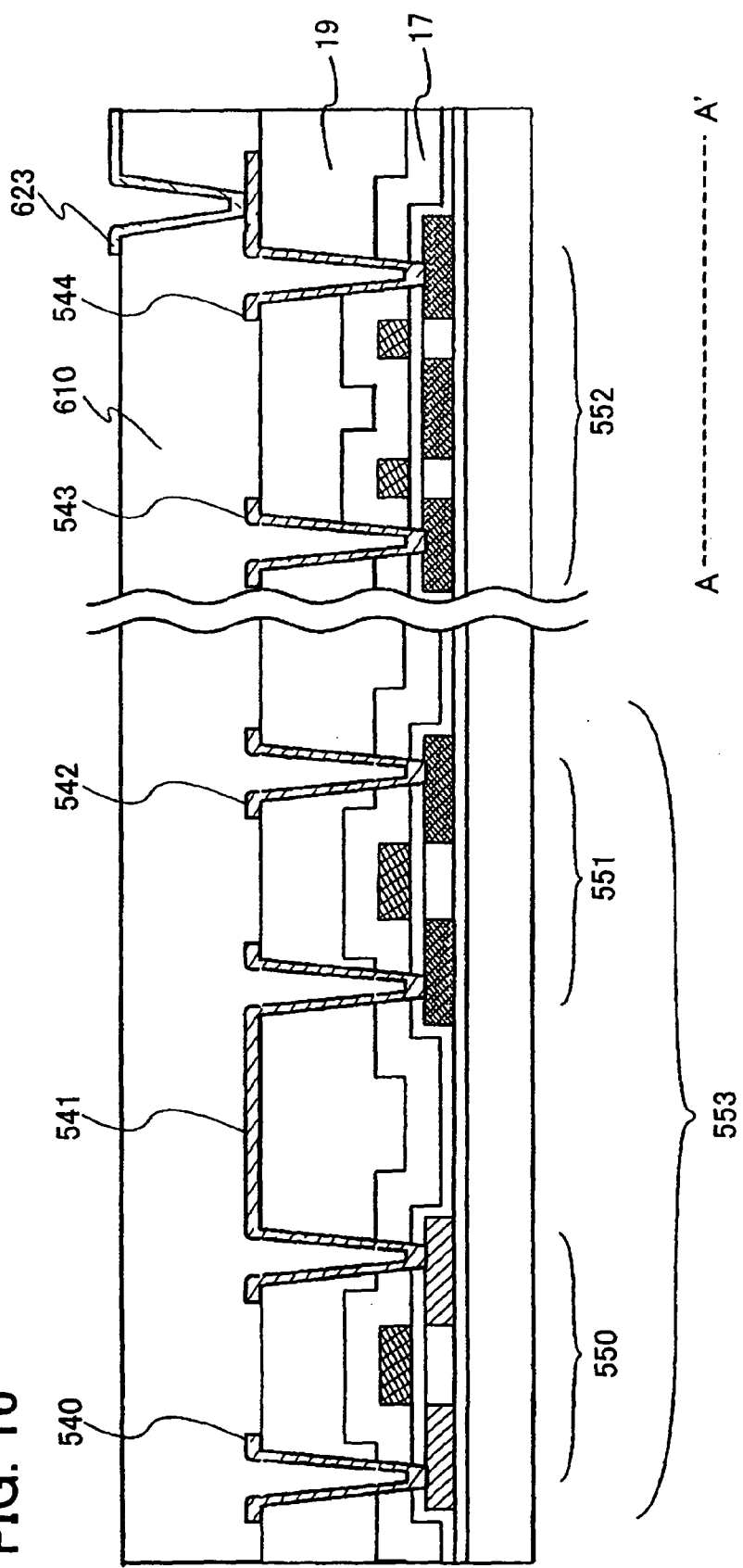
FIG. 16 is cross sectional view describing a method for manufacturing a liquid crystal display device of Embodiment Mode 4.

First, steps up to forming a TFT shown in FIG. 16 are carried out in accordance with the above embodiment mode. Note that parts that are the same as those in the above embodiment mode are denoted by the same reference numerals. Note that in this embodiment mode, a transistor 552 that is a pixel TFT is a multi-gate TFT.

After forming the interlayer insulating film 17 shown in FIG. 9D, a planarization film which is to be a second interlayer insulating film 19 is formed. As the planarization film, the one mentioned in the above embodiment mode can be used.

Next, contact holes are formed in the second interlayer insulating film 19 and the interlayer insulating film 17 using resist masks.

A resist mask is formed over the second interlayer insulating film 19, and the second interlayer insulating film 19 and the interlayer insulating film 17 are etched using the resist mask, so that a contact hole disposed on a source region and a contact hole disposed on a drain region are formed.

After removing the resist mask and forming a conductive film, etching is carried out using yet another resist mask, thereby forming electrodes or wires 540 to 544 (a source wire or a drain wire or the like of the TFT). As the conductive film, a layered film of TiN, Al, and TiN or an Al alloy film or the like can be used.

Here, the electrode or the wire is preferably led so as to have a round corner when seen from a direction perpendicular to the substrate. By making the corners round, dust or the like can be prevented from remaining at the corners of the wire; thus, the number of defects generated due to dust can be reduced and yield can be improved. A mask manufactured by exposure and development using a photosensitive resist as a photomask is used for patterning. Note that the electrodes or the wires 540 to 544 have repeated patterns in which each pattern has the same shape and is arranged at the same interval. Therefore, such repeated patterns can be exposed by direct writing at high speed without using a photomask if the exposure apparatus in FIG. 1 is used.

Next, a third interlayer insulating film 610 is formed over the second interlayer insulating film 19 and the wires or electrodes 540 to 544. Note that the third interlayer insulating film 610 can be formed using the similar material to the second interlayer insulating film 19.

Next, a resist mask is formed using a direct writing mask and an exposure apparatus for direct writing in FIG. 1, and the third interlayer insulating film 610 is partially removed by dry etching so as to form an opening (contact hole). In forming this contact hole, carbon tetrafluoride ($CF_4$), oxygen ($O_2$) and helium (He) are used as an etching gas. Note that the bottom of the contact hole reaches the electrode or wire 544.

Then, after removing the resist mask, a second conductive film is formed over the entire surface. Then, the second conductive film is patterned using a photomask, thereby forming a pixel electrode 623, which is electrically connected to the electrode or wire 544 (FIG. 16). When a reflective liquid crystal display panel is manufactured, the pixel electrode 623 may be formed by sputtering using a light-reflective metal material such as Ag (silver), Au (gold), Cu (copper), W (tungsten) or Al (aluminum).

In the case of manufacturing a transmissive liquid crystal display panel, the pixel electrode 623 is formed using a transparent conductive film such as indium tin oxide (ITO), indium tin oxide containing silicon oxide, zinc oxide (ZnO) or tin oxide ($SnO_2$).

Figure 17:
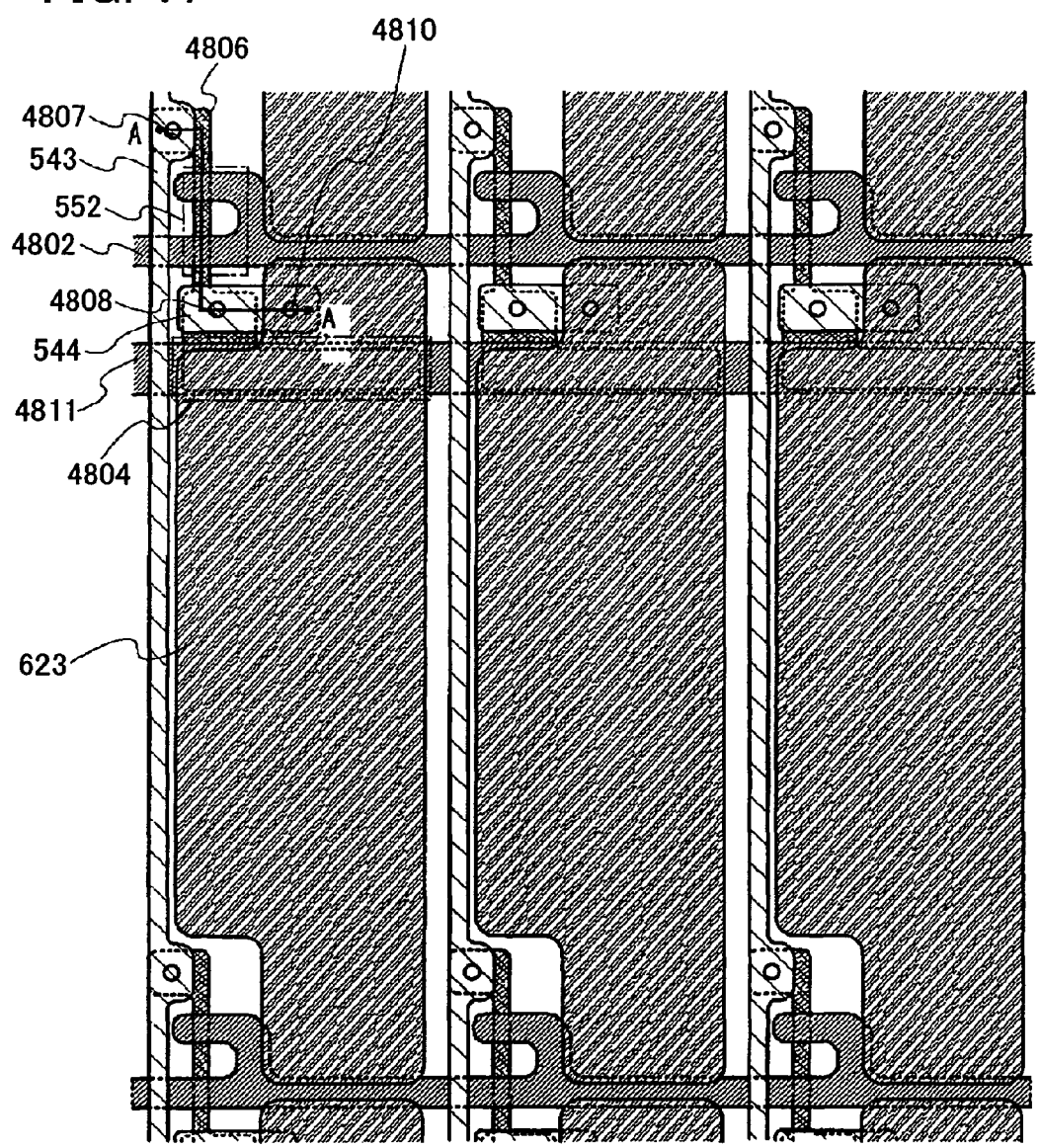
FIG. 17 is a top view describing a method for manufacturing a liquid crystal display device of Embodiment Mode 4.

FIG. 17 is a magnified top view of a part of the pixel portion including a pixel TFT. Furthermore, FIG. 16 shows the one in the middle of forming a pixel electrode, and the right pixel in FIG. 16 shows a state in which a pixel electrode is formed and the left pixel in FIG. 16 shows a state in which a pixel electrode is not formed. A cross-sectional view taken along a solid line A-A' of FIG. 17 corresponds to a cross section of the pixel portion in FIG. 16, and portions corresponding to those in FIG. 16 are denoted by the same reference numerals.

A pixel is provided at an intersection of a source signal line 543 and a gate signal line 4802, and is provided with a transistor 552, a capacitor element 4804, and a liquid crystal element. Note that only one of a pair of electrodes for driving liquid crystal of a liquid crystal element (pixel electrode 623) is shown in the figure.

The transistor 552 includes a semiconductor layer 4806, a first insulating film, and a part of the gate signal line 4802 which overlaps with the semiconductor layer 4806 with the first insulating film therebetween. The semiconductor layer 4806 is to be an active layer of the transistor 552. The first insulating film serves as a gate insulating film of the transistor. Either the source or the drain of the transistor 552 is connected to a source signal line 543 through a contact hole 4807, and the other is connected to the connection wire 544 through a contact hole 4808. The connection wire 544 is connected to the pixel electrode 623 through a contact hole 4810. The connection wire 544 can be formed using the same conductive layer as the source signal line 543 by being patterned simultaneously.

The capacitor element 4804 is a capacitor element having a structure using the semiconductor layer 4806 and a capacitor wire 4811 which overlaps with the semiconductor layer 4806 with the first insulating film therebetween as a pair of electrodes, and the first insulating layer as a dielectric layer (referred to as a first capacitor element). Note that alternatively, the capacitor element 4804 may have a structure using the capacitor wire 4811 and the pixel electrode 623 which overlaps with the capacitor wire 4811 with a second insulating film therebetween as a pair of electrodes, and the second insulating layer as a dielectric layer (referred to as a second capacitor element). Since the second capacitor element is connected in parallel with the first capacitor element, capacitance of the capacitor element 4804 can be increased by providing the second capacitor element. Further, the capacitor wire 4811 can be formed simultaneously with the gate signal line 4802 by patterning a conductive layer, which is also used for forming the gate signal line 4802.

A pattern of the semiconductor layer 4806, the gate signal line 4802, the capacitor wire 4811, the source signal line 543, the connection wire 544, and the pixel electrode 623 has a shape chamfered by a side length of 10 μm or shorter in the corner. By manufacturing a mask pattern using the direct writing mask and the exposure apparatus in FIG. 1, and patterning using the mask pattern, a shape in which a corner of the pattern is chamfered can be obtained. Note that the corners of the pattern may be further rounded. In other words, by setting an exposure condition and an etching condition appropriately, a pattern shape may be smoothed more than the mask pattern.

When a corner of a bent portion or a portion where wire width changes is smoothed and rounded in a wire and an electrode, there are effects described below. When dry etching using plasma is performed, generation of fine particles due to abnormal discharge can be suppressed by chamfering a projecting portion. Even though the fine particles are generated, the fine particles can be prevented from accumulating at the corner at the time of cleaning, and the fine particles can be washed away by chamfering a concave portion. Thus, a problem of fine particles or dust in the manufacturing process can be solved and the yield can be improved.

Through the aforementioned steps, a TFT substrate of a liquid crystal display device is completed, where the transistor 552 that is a top-gate pixel TFT, a CMOS circuit 553 having top-gate TFTs 550 and 551, and the pixel electrode 623 are formed over the substrate.

Then, an alignment film 624a is formed covering the pixel electrode 623. The alignment film 624a may be formed by a droplet discharge method, a screen printing or an offset printing. After that, the surface of the alignment film 624a is rubbed.

Figure 18A:
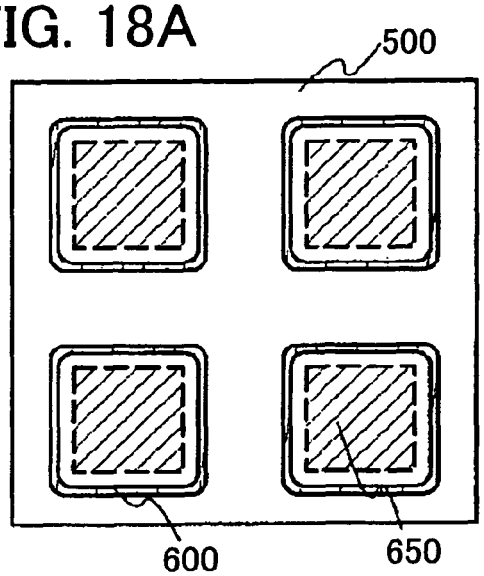
FIGS. 18A to 18D are top views describing a method for manufacturing a liquid crystal display device of Embodiment Mode 4.
Figure 19:
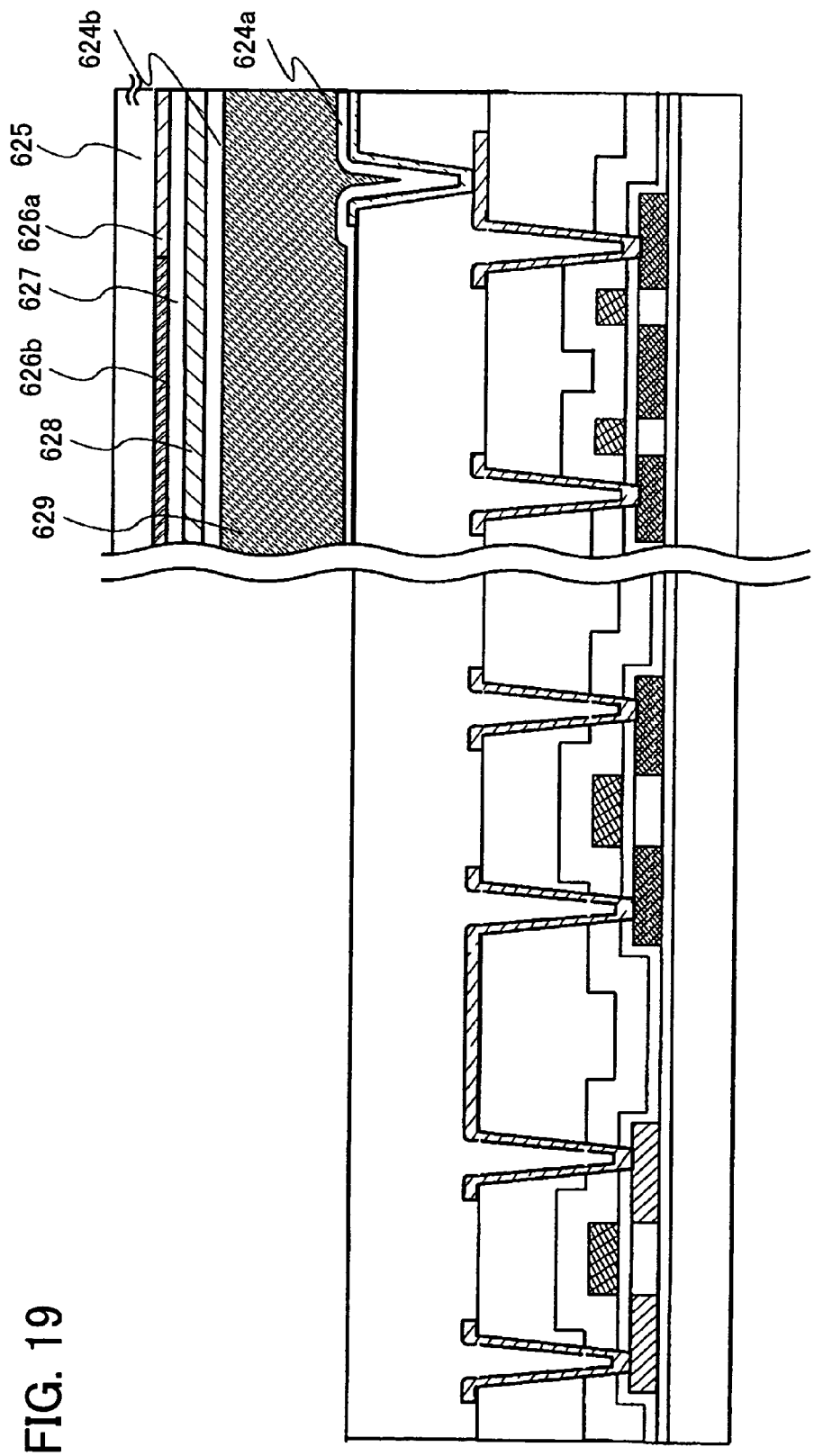
FIG. 19 is a cross sectional view describing a method for manufacturing a liquid crystal display device of Embodiment Mode 4.

A color filter including a color layer 626a, a light-shielding layer (black matrix) 626b and an overcoat layer 627 is provided over a counter substrate 625, and a transparent or reflective counter electrode 628 and an alignment film 624b are formed thereover (FIG. 19). Then, a sealant 600 having a closed pattern is formed by a droplet discharge method so as to surround a region overlapping the pixel portion 650 including a pixel TFT (FIG. 18A). Since liquid crystal is dropped here, an example of applying the sealant 600 so as to form a closed pattern is shown. Alternatively, a dip method (pumping method) may be used, in which liquid crystal is introduced into the space between the substrates by utilizing capillary action after attaching the substrate 500 to the counter substrate 625.

Figure 18B:
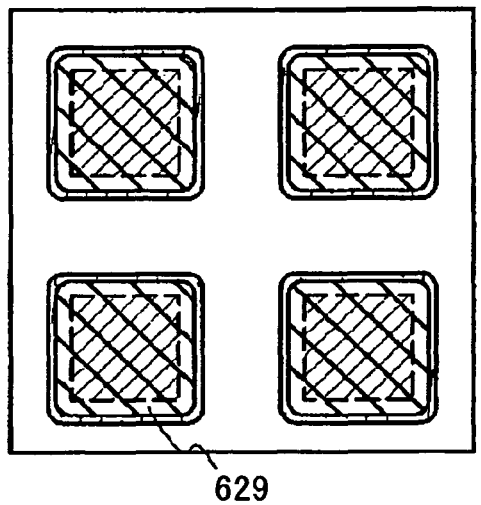
Figure 18C:
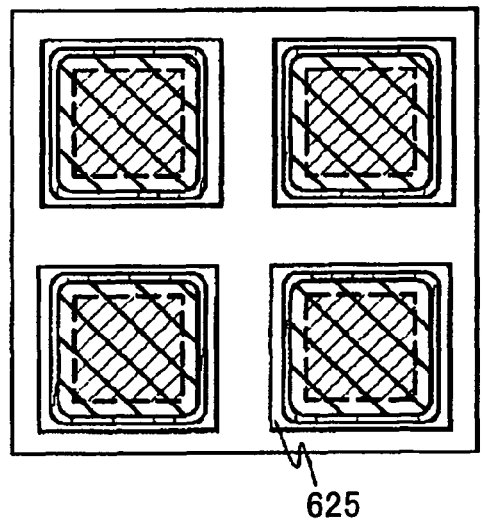

Then, a liquid crystal composition 629 is dropped under reduced pressure so that bubbles are not mixed therein (FIG. 18B), thereby attaching the substrates 500 and 625 to each other (FIG. 18C). A liquid crystal is dropped once or a plurality of times into the seal pattern having a closed loop. As an alignment mode of the liquid crystal composition 629, a TN mode is used in which the alignment of liquid crystal molecules is twisted at 90° from where light enters to where light is emitted. The substrates are attached to each other in such a manner that the rubbing directions thereof are perpendicular to each other.

The distance between the pair of the substrates may be kept by dispersing spherical spacers or forming a columnar spacer formed of a resin, or by mixing fillers in the sealant 600. The aforementioned columnar spacer is formed of an organic resin material containing at least one of acrylic, polyimide, polyimide amide, or epoxy as a main component, or an inorganic material having one of silicon oxide, silicon nitride and silicon oxide containing nitrogen, or a layered film thereof.

Figure 18D:
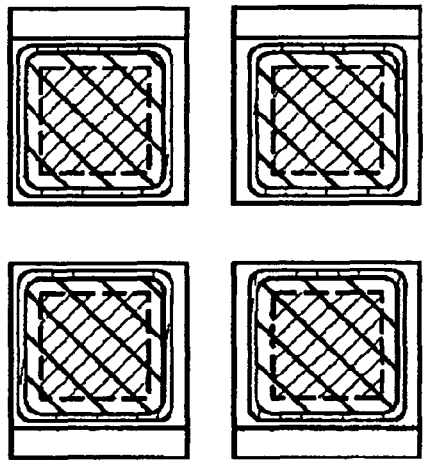

Then, the substrate is sectioned. In the case of obtaining a multiplicity of panels from one substrate, the substrate is sectioned into each panel. On the other hand, in the case of obtaining one panel from one substrate, a sectioning step may be omitted by attaching a counter substrate which is cut in advance to the substrate (FIG. 19 and FIG. 18D).

Then, an FPC (Flexible Printed Circuit) is attached to an anisotropic conductive layer using a known technique. Through the aforementioned steps, a liquid crystal display device is completed. In addition, an optical film is attached if necessary. In the case of manufacturing a transparent liquid crystal display device, a polarizing plate is attached to each of the TFT substrate and the counter substrate.

Figure 20A:
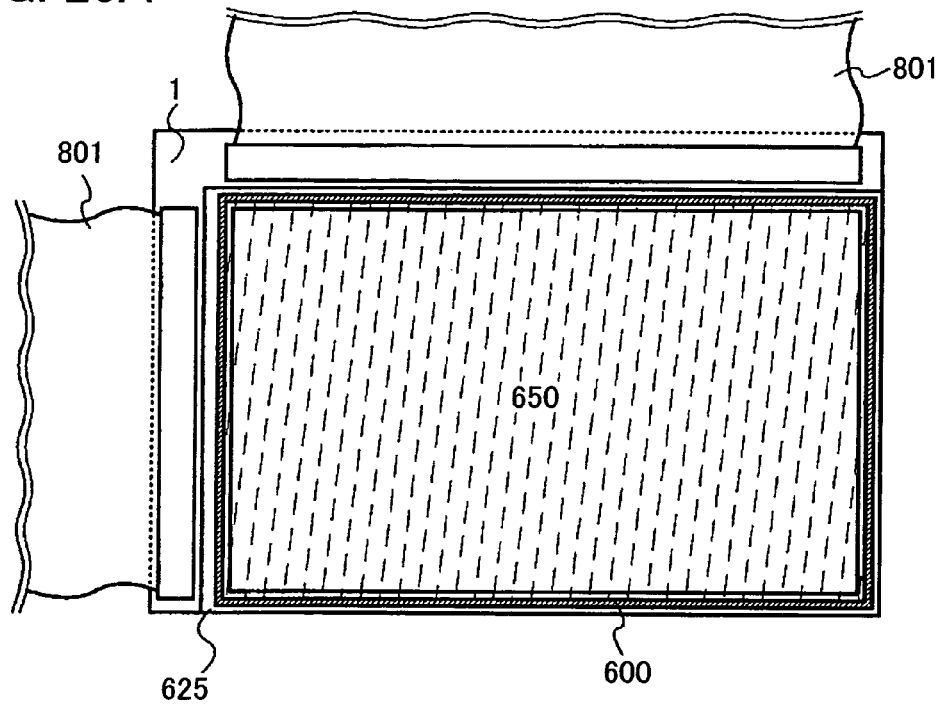
FIGS. 20A and 20B are top views showing a method for manufacturing a liquid crystal display device of Embodiment Mode 4.
Figure 20B:
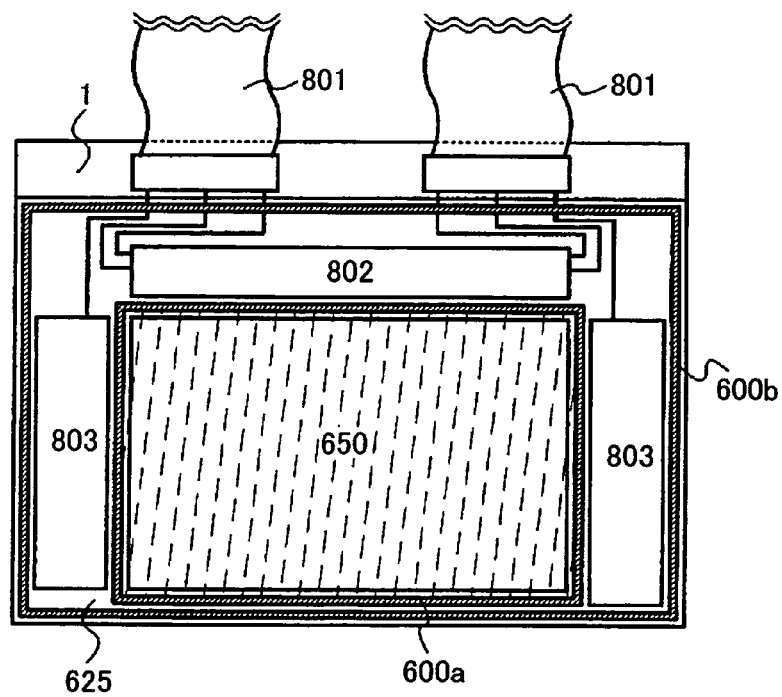

FIG. 20A shows a top view of a liquid crystal display device obtained through the aforementioned steps, and FIG. 20B shows an example of a top view of another liquid crystal display device.

In FIG. 20A, reference numeral 1 denotes a TFT substrate, 625 denotes a counter substrate, 650 denotes a pixel portion, 600 denotes a sealant and 801 denotes an FPC. Here, a liquid crystal composition is discharged by a droplet discharge method, and the pair of the substrates 500 and 625 is attached to each other with the sealant 600 under the reduced pressure.

In FIG. 20B, reference numeral 1 denotes a TFT substrate, 625 denotes a counter substrate, 802 denotes a source signal line driver circuit, 803 denotes a gate signal line driver circuit, 650 denotes a pixel portion, 600a denotes a first sealant, and 801 denotes an FPC. Here, a liquid crystal composition is discharged by a droplet discharge method, and the pair of the substrates 500 and 625 is attached to each other with the first sealant 600a and the second sealant 600b. Since liquid crystal is not required in the driver circuit areas 802 and 803, liquid crystal is held only in the pixel portion 650, and the second sealant 600b is provided for reinforcement of the whole panel.

As described above, in this embodiment, a liquid crystal display device can be manufactured using a TFT using the invention. Accordingly, the manufacturing time and cost can be reduced. The liquid crystal display device manufactured in this embodiment can be used as display areas of various electronic devices.

Note that although a top-gate TFT is used as the TFT in this embodiment mode, the invention is not limited to this structure, and a bottom-gate (inverted staggered) TFT or a staggered TFT may be used as appropriate. Further, the invention is not limited to a multi-gate TFT, and a single-gate TFT may be used.

This embodiment mode can be freely combined with any of the aforementioned embodiment modes as required.

[Embodiment Mode 5]

In embodiment Mode 5, an example of manufacturing a light emitting device according to the present invention is described with reference to drawings. First, steps up to forming a TFT shown in FIG. 21 are carried out. Note that parts that are the same as those in the above embodiment mode are denoted by the same reference numerals. Note that FIG. 21 shows only one of TFTs. Note that when manufacturing a TFT, direct writing can be performed using the exposure apparatus in FIG. 1. Accordingly, cost and time for manufacturing a new mask are not required, and low cost can be realized.

Figure 21A:
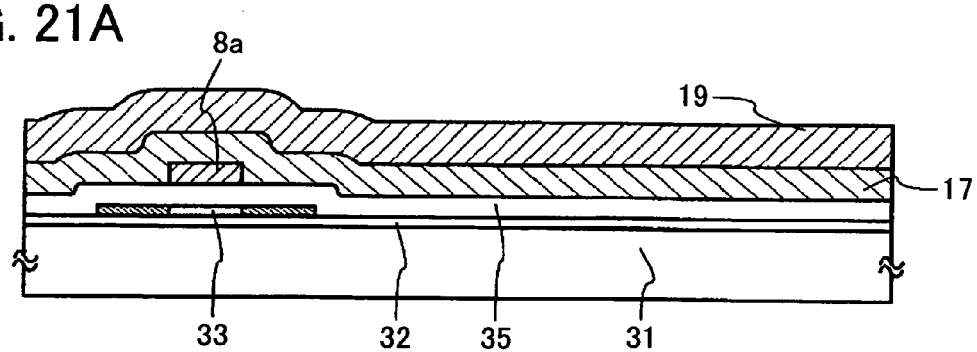
FIGS. 21A to 21D cross sectional views describing a method for manufacturing a light emitting device according to Embodiment Mode 5.

After forming an interlayer insulating film 17, a planarization film to be a second interlayer insulating film 19 is formed. As the planarization film, one described in the above embodiment mode can be used (FIG. 21A).

A contact hole is formed in the second interlayer insulating film 19 and the interlayer insulating film 17 using a resist mask.

Figure 21B:
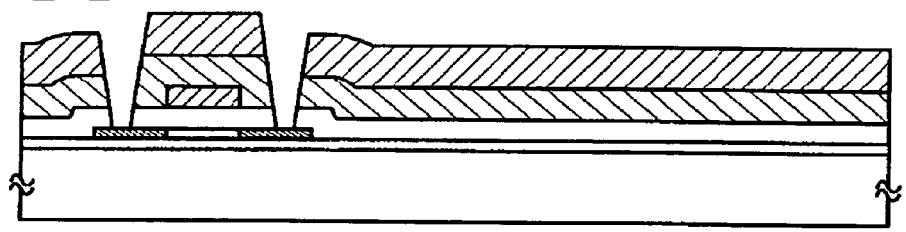

Next, the contact holes that reach a semiconductor layer are formed. The contact holes can be formed by etching using a resist mask until the semiconductor layer is exposed. Either wet etching or dry etching can be carried out. The etching may be conducted once or a plurality of times depending on the condition. When the etching is conducted a plurality of times, both wet etching and dry etching may be conducted (FIG. 21B).

Figure 21C:
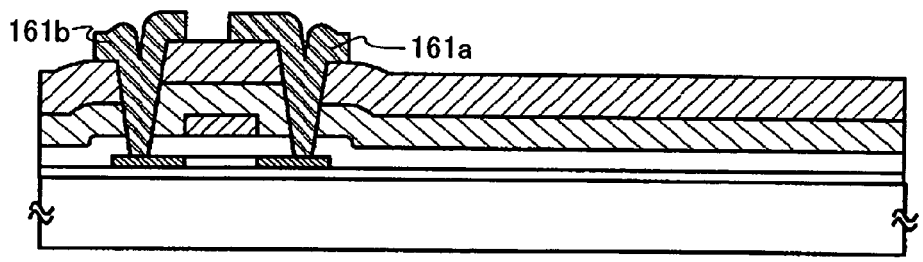

Then, a conductive layer is formed so as to cover the contact holes and the second interlayer insulating film 19. A connection portion 161a, a wire 161b, and the like are formed by processing the conductive layer into a desired shape. This wire may be a single layer of aluminum; copper; an alloy of aluminum, carbon, and nickel; an alloy of aluminum, carbon, and molybdenum; or the like. Alternatively, the wire may be formed in a layered structure of molybdenum, aluminum, molybdenum in the order from the substrate side. Alternatively, a structure of titanium, aluminum, and titanium or a structure of titanium, titanium nitride, aluminum, and titanium can also be used (FIG. 21C). By using an exposure apparatus of FIG. 1 for forming the conductive layer into a desired shape, low cost can be realized.

Figure 21D:
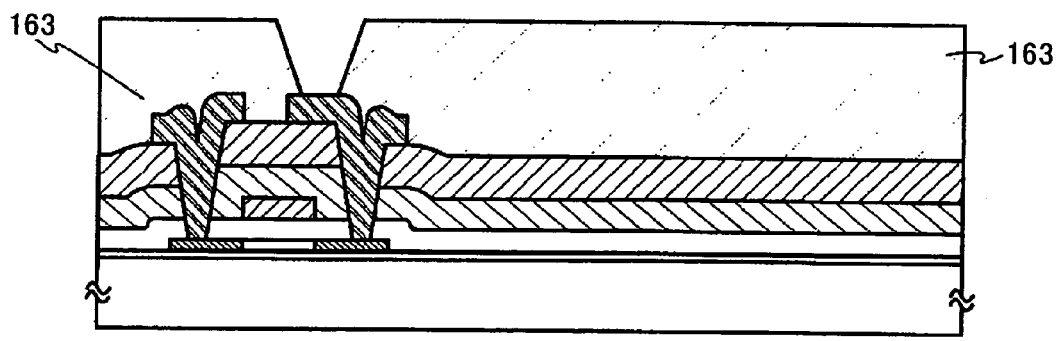

A third interlayer insulating film 163 is formed to cover the connection portion 161a, the wire 161b, and the second interlayer insulating film 19. As the material of the third interlayer insulating film 163, a self-planarizing coating film formed of acrylic, polyimide, siloxane, or the like is preferably used. In this embodiment mode, the third interlayer insulating film 163 is formed of siloxane (FIG. 21D).

Next, an insulating film may be formed of silicon nitride over the third interlayer insulating film 163. This is formed to prevent the third interlayer insulating film 163 from being etched more than necessary in a later step of etching a pixel electrode. Therefore, the insulating film is not necessary when the difference is large between the etching rates of the pixel electrode and the third interlayer insulating film.

Next, a contact hole penetrating the third interlayer insulating film 163 to reach the connection portion 161a is formed. After a light-transmitting conductive layer is formed so as to cover the contact hole and the third interlayer insulating film 163 (or the insulating film), the light-transmitting conductive layer is processed to form the first electrode 164 of the thin film light emitting element. Here, the first electrode 164 electrically contacts the connection portion 161a.

The first electrode 164 can be formed from a material of a conductive metal such as aluminum (Al), silver (Ag), gold (Au), platinum (Pt), nickel (Ni), tungsten (W), chromium (Cr), molybdenum (Mo), iron (Fe), cobalt (Co), copper (Cu), palladium (Pd), lithium (Li), cesium (Cs), magnesium (Mg), calcium (Ca), strontium (Sr), or titanium (Ti); an alloy thereof such as aluminum —Si (Al—Si), aluminum-titanium (Al—Ti), or aluminum-silicon-copper (Al—Si—Cu); a nitride of a metal material such as titanium nitride (TiN), a metal compound such as indium tin oxide (indium tin oxide), ITO containing silicon, IZO (indium zinc oxide) in which 2 wt % to 20 wt % of zinc oxide (ZnO) is mixed in indium oxide, or the like.

Figure 22A:
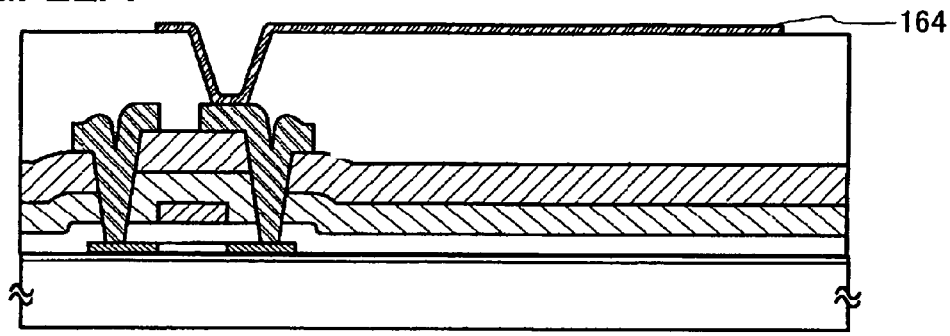
FIGS. 22A to 22C are cross sectional views showing a method for manufacturing a light emitting device according to Embodiment Mode 5.

An electrode from which light is emitted may preferably be formed using a transparent conductive film. For example, a metal compound such as ITO (indium tin oxide), ITO containing silicon (ITSO), or IZO (indium zinc oxide) in which 2 to 20 wt % of zinc oxide (ZnO) is mixed in indium oxide can be used. Alternatively, an extremely thin film of metal such as Al or Ag is used. When light is emitted through a second electrode, a highly-reflective material (e.g., Al, Ag or the like) can be used for the first electrode 164. In this embodiment mode, ITSO is used for the first electrode 164 (FIG. 22A).

Figure 22B:
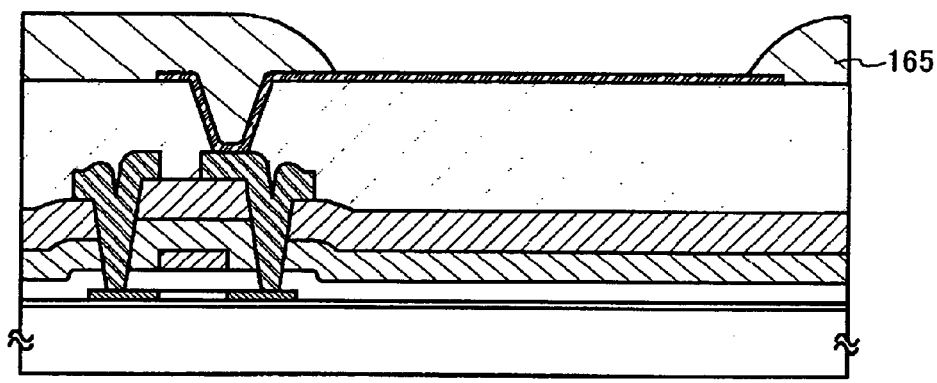

Next, an insulating film formed of an organic material or an inorganic material is formed so as to cover the third interlayer insulating film 163 (or the insulating film) and the first electrode 164. Subsequently, the insulating film is processed so as to partially expose the first electrode 164, thereby forming a partition wall 165. As the material of the partition wall 165, a photosensitive organic material (such as acrylic or polyimide) is preferable. Alternatively, a non-photosensitive organic or inorganic material may also be used. Further, the partition wall 165 may be used as a black matrix by making the partition wall 165 black in such a way that a black pigment or dye such as titanium black or carbon nitride is diffused into the material of the partition wall 165 using a dispersant or the like. It is desirable that the partition wall 165 has a tapered shape where its end surface toward the first electrode has curvature changing continuously (FIG. 22B).

Figure 22C:
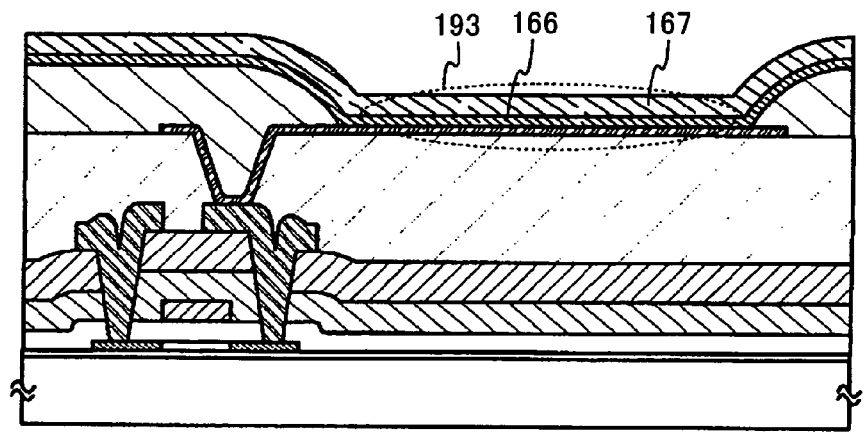

Next, a layer 166 containing a light emitting substance is formed, and a second electrode 167 covering the layer 166 containing the light emitting substance is formed subsequently. Thus, a light emitting element 193 in which the layer 166 containing a light emitting substance is sandwiched between the first electrode 164 and the second electrode 167 can be manufactured, and light emission can be obtained by applying a higher voltage to the first electrode than to the second electrode (FIG. 22C). For an electrode material used for forming the second electrode 167, the similar material to the material of the first electrode can be used. Aluminum is used for the second electrode in this embodiment mode.

Further, a layer 166 containing a light emitting substance is formed by vapor deposition, an ink-jet method, spin coating, dip coating, or the like. The layer 166 containing a light emitting substance may be a stack of layers having various functions such as a hole transport, hole injection, electron transport, electron injection, light emission, or may be a single layer of a light emitting layer. Further, a single layer or a stack of an organic compound is often used for the material used for the layer containing a light emitting substance; however, in this invention, for example, an inorganic compound may be added to a part of a film containing an organic compound to form a layer which is in contact with the first electrode or the second electrode.

After that, a silicon oxide film containing nitrogen is formed as a passivation film by plasma CVD. In the case of using the silicon oxide film containing nitrogen, a silicon oxynitride film manufactured using $SiH_4$, $N_2O$, and $NH_3$ by plasma CVD, a silicon oxynitride film manufactured using $SiH_4$ and $N_2O$ by plasma CVD, or a silicon oxynitride film manufactured by plasma CVD using a gas in which $SiH_4$ and $N_2O$ are diluted with Ar may be preferably formed.

As the passivation film, a silicon oxynitride hydride film manufactured using $SiH_4$, $N_2O$, and $H_2$ is also applicable. Naturally, the structure of a first passivation film is not limited to a single-layer structure, and the passivation film may be formed to have a single-layer structure or a layered structure including another insulating layer containing silicon. A multilayer film of a carbon nitride film and a silicon nitride film, a multilayer film including a styrene polymer, a silicon nitride film, or a diamond-like carbon film may be formed instead of a silicon oxide film containing nitrogen.

Subsequently, in order to protect the light emitting element from a deterioration-promoting material such as water, the display area is sealed. In the case of using a counter substrate for the sealing, the counter substrate and an element substrate are attached together with an insulating sealant so as to expose an external connection portion. The space between the counter substrate and the element substrate may be filled with an inert gas such as dry nitrogen, or the whole surface of the pixel portion may be coated with the sealant for attaching the counter substrate. It is preferable to use an ultraviolet curable resin or the like for the sealant. A drying agent or particles for keeping the gap between the substrates uniform may be mixed into the sealant. Subsequently, a flexible wire substrate is pasted on the external connection portion, thereby completing a light emitting device.

An example of the structure of the thus manufactured light emitting device will be described with reference to FIGS. 23A and 23B. Although the shapes are different, parts having the similar functions are denoted by the same reference numerals and the description thereof may be omitted. In this embodiment mode, a thin film transistor 170 connects to the light emitting element 193 via the connection portion 161a.

Figure 23A:
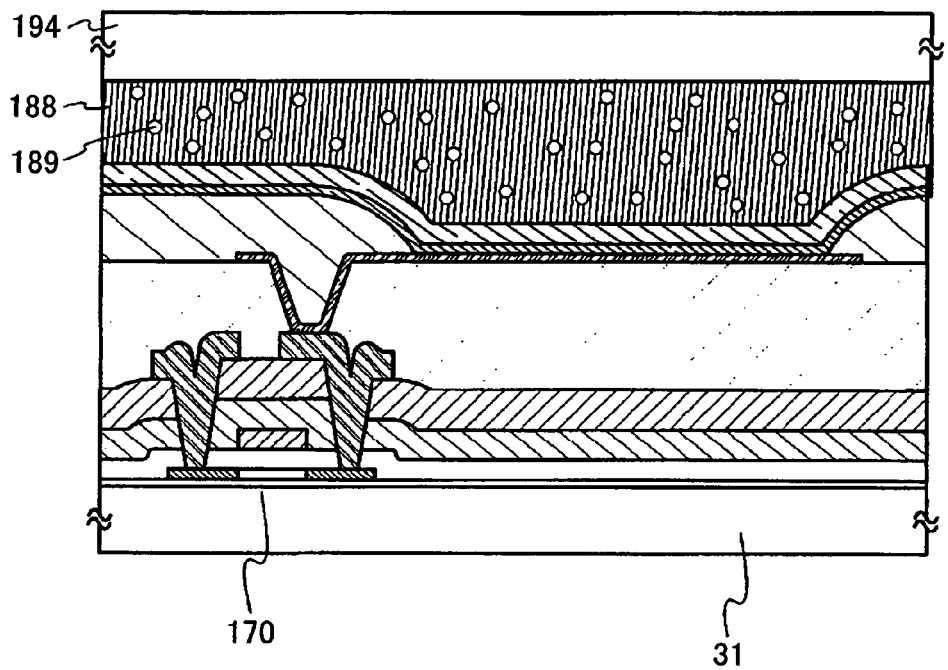
FIGS. 23A and 23B are cross sectional views showing a method for manufacturing a light emitting device according to Embodiment Mode 5.

In FIG. 23A, the first electrode 164 is formed of a light-transmitting conductive film and has a structure in which light emitted from the layer 166 containing the light emitting substance is extracted from the substrate 31 side. Reference numeral 194 denotes a counter substrate, which is to be fixed to the substrate 31 with a sealant or the like after forming the light emitting element 193. By filling the space between the counter substrate 194 and the element with a light-transmitting resin 188 or the like and sealing the space, it is possible to prevent the light emitting element 193 from deteriorating due to moisture. Further, the resin 188 desirably has hygroscopicity. In addition, it is more desirable that a desiccant 189 having high light-transmitting properties is diffused in the resin 188, so that the effect of moisture can be further suppressed.

Figure 23B:
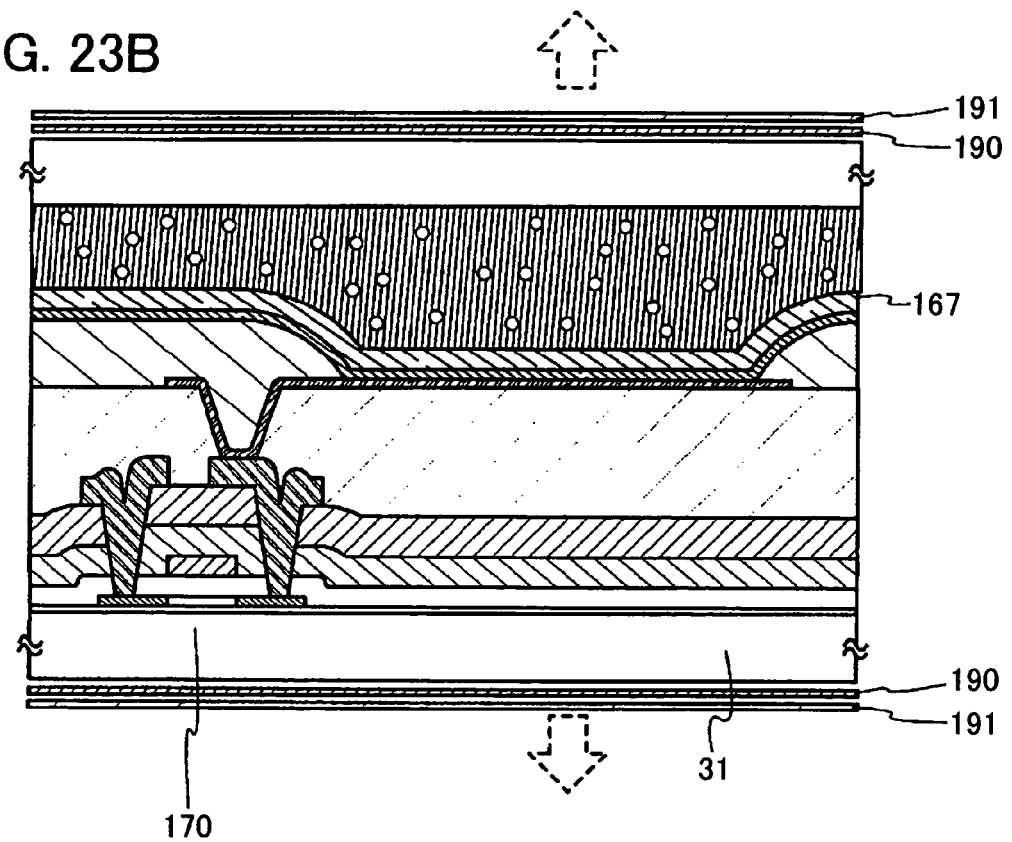

In FIG. 23B, each of the first electrode 164 and the second electrode 167 is formed with a light-transmitting conductive film, and light can be extracted from both the substrate 31 and the counter substrate 194. With this structure, it is possible to prevent the screen from being translucent by separately providing polarizing plates 190 outside the substrate 31 and the counter substrate 194, whereby increasing the visibility. A protective film 191 is preferably provided outside the polarizing plate 190.

Either an analog video signal or a digital video signal may be used in the light emitting device having a display function according to the present invention. The digital video signal includes a video signal using voltage and a video signal using current. When the light emitting element emits light, the video signal inputted into a pixel uses a constant voltage or a constant current. When the video signal uses a constant voltage, the voltage applied to the light emitting element or the current flowing in the light emitting element is constant. Meanwhile, when the video signal uses a constant current, the voltage applied to the light emitting element or the current flowing in the light emitting element is constant. The light emitting element to which a constant voltage is applied is driven by constant voltage, and the light emitting element in which the constant current flows is driven by the constant current. Constant current flows in the light emitting element driven by the constant current without being affected by the change in the resistance of the light emitting element. Whichever of the driving methods described above can be used for a light emitting device or a driving method according to the present invention.

A light emitting device according to the present invention having such a structure is a highly reliable light emitting device. A light emitting device according to the present invention having such a structure is a light emitting device which can provide a blue light emission with good color purity. Further a light emitting device according to the present invention having such a structure is a light emitting device which can provide good color reproductivity. This embodiment mode can be combined with an appropriate structure of any of the above embodiment modes.

[Embodiment Mode 6]

Figure 24A:
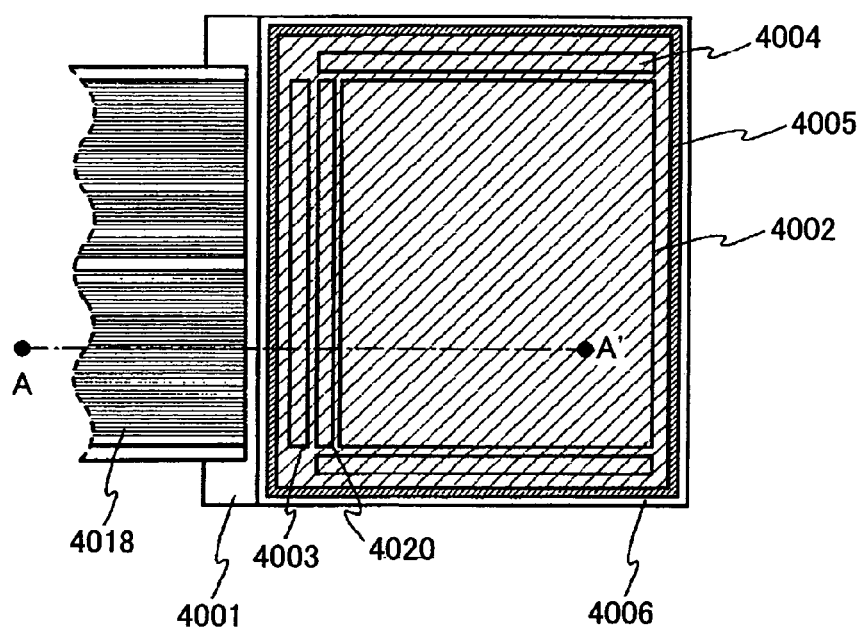
FIG. 24A is a plane view showing a light emitting device of Embodiment Mode 6.
Figure 24B:
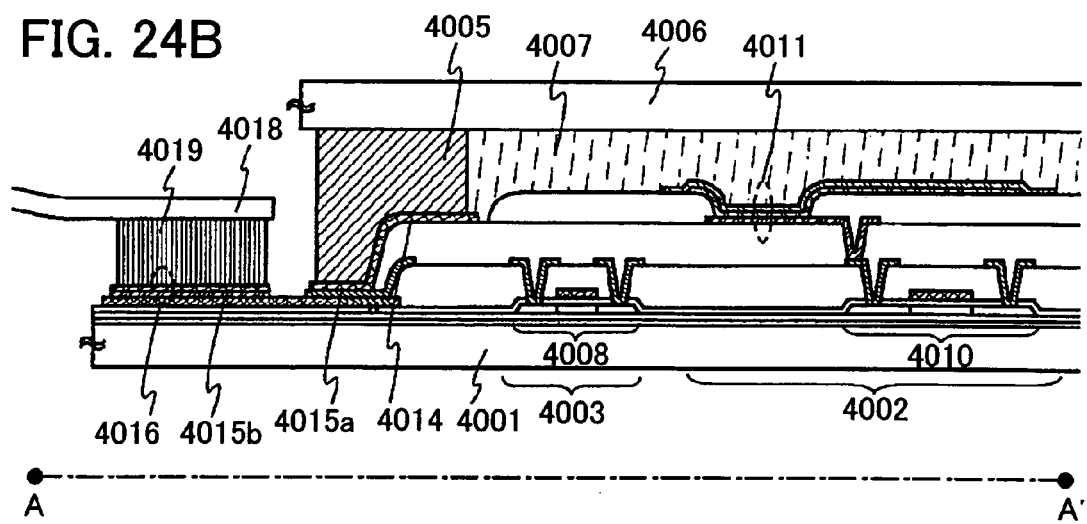
FIG. 24B is a cross sectional view along a line A-A' of FIG. 24A.

This embodiment mode will describe an appearance of a panel which is a light emitting device of the present invention with reference to FIGS. 24A and 24B. FIG. 24A is a top view of a panel in which transistors and light emitting elements formed over a substrate 4001 are sealed with a sealant formed between the substrate 4001 and a counter substrate 4006. FIG. 24B is a cross-sectional view corresponding to FIG. 24A. The light emitting element mounted on this panel has a structure as described in the above embodiment mode.

A sealant 4005 is provided so as to surround a pixel portion 4002, a signal line driver circuit 4003, and a scan line driver circuit 4004 which are provided over the substrate 4001. In addition, the counter substrate 4006 is provided over the pixel portion 4002, the signal line driver circuit 4003, and the scan line driver circuit 4004. Thus, the pixel portion 4002, the signal line driver circuit 4003, and the scan line driver circuit 4004 together with a filler 4007 are sealed with the substrate 4001, the sealant 4005, and the counter substrate 4006.

The pixel portion 4002, the signal line driver circuit 4003, and the scan line driver circuit 4004 provided over the substrate 4001 have a plurality of thin film transistors. FIG. 24B shows a thin film transistor 4008 included in the signal line driver circuit 4003 and a thin film transistor 4010 included in the pixel portion 4002. The light emitting element 4011 is electrically connected to the thin film transistor 4010.

Further, a wire 4014 corresponds to a wire for supplying a signal or power source voltage to the pixel portion 4002, the signal line driver circuit 4003, and the scan line driver circuit 4004. The wire 4014 is connected to a connection terminal 4016 through a wire 4015. The connection terminal 4016 is electrically connected to a terminal of a flexible printed circuit (FPC) 4018 through an anisotropic conductive film 4019.

As the filler 4007, other than inert gas such as nitrogen or argon, an ultraviolet curable resin or a thermosetting resin can be used. For example, polyvinyl chloride, acrylic, polyimide, an epoxy resin, a silicone resin, polyvinyl butyral, or ethylene vinylene acetate can be used.

It is to be noted that the light emitting device according to the present invention includes in its category the panel in which the pixel portion having the light emitting elements is formed and a module in which an IC is mounted on the panel. This embodiment mode can be used in appropriate combination with a structure of any one of the above embodiment modes as appropriate.

[Embodiment Mode 7]

This embodiment mode will describe a pixel circuit and a protective circuit in the panel and the module shown in Embodiment Mode 6, and their operations. FIGS. 21A to 24B are cross sectional views of a driving TFT 1403 or a switching TFT 1401 and a light emitting element 1405.

Figure 25A:
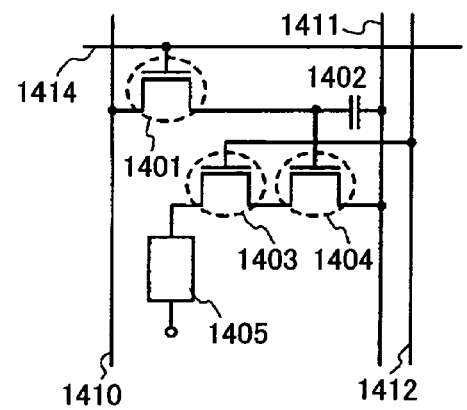
FIGS. 25A to 25F are circuit diagrams showing pixel circuits of a light emitting device of Embodiment Mode 7.

A pixel shown in FIG. 25A includes a signal line 1410 and power source lines 1411 and 1412 in a column direction and a scan line 1414 in a row direction. The pixel further includes a switching TFT 1401, the driving TFT 1403, a current control TFT 1404, a capacitor element 1402, and a light emitting element 1405.

Figure 25B:
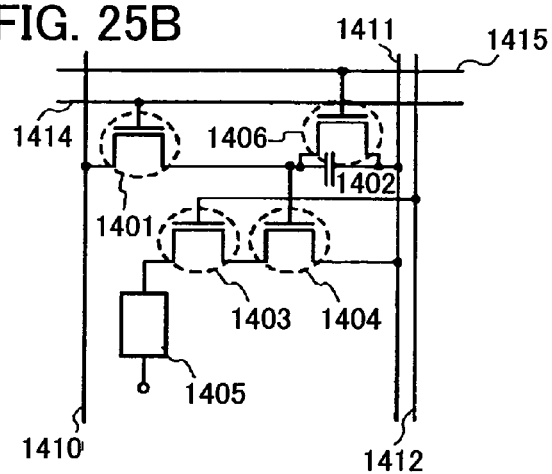
Figure 25C:
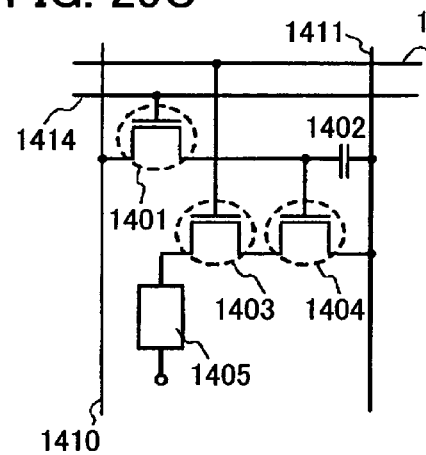
Figure 25D:
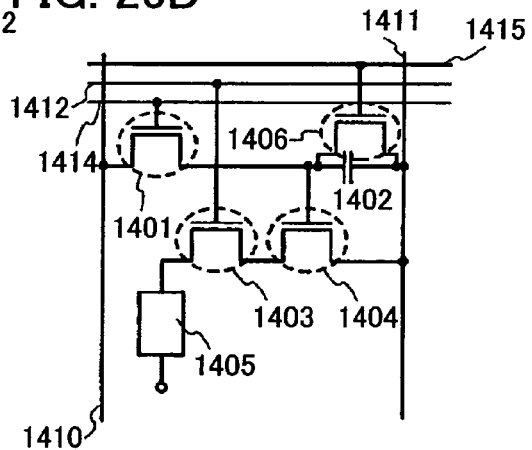

A pixel shown in FIG. 25C has the same structure as that in FIG. 25A except for that a gate electrode of the driving TFT 1403 is connected to the power source line 1412 provided in a row direction. In other words, the pixels shown in FIGS. 25A and 25C have the same equivalent circuit diagram. However, in the case of arranging the power source line 1412 in the column direction (FIG. 25A) and in the case of arranging the power source line 1412 in the row direction (FIG. 25C), each power source line is formed using a conductive film in different layers. Here, attention is paid to a wire connected to the gate electrode of the driving TFT 1403, and the structure is shown separately in FIGS. 25A and 25C in order to show that these wires are manufactured in different layers.

As a feature of the pixels shown in FIGS. 25A and 25C, the driving TFT 1403 and the current control TFT 1404 are connected serially within the pixel, and it is preferable to set the channel length L (1403) and the channel width W (1403) of the driving TFT 1403, and the channel length L (1404) and the channel width W (1404) of the current control TFT 1404 so as to satisfy L (1403)/W (1403):L (1404)/W (1404)=5 to 6000:1.

The driving TFT 1403 operates in a saturation region and serves to control the current value of the current flowing into the light emitting element 1405. The current control TFT 1404 operates in a linear region and serves to control the current supplied to the light emitting element 1405. Both the driving TFT 1403 and the current control TFT 1404 preferably have the same conductivity type considering the manufacturing process, and the driving TFT 1403 and the current control TFT 1404 are n-channel type TFTs in this embodiment mode. The driving TFT 1403 may be either an enhancement mode TFT or a depletion mode TFT. Since the current control TFT 1404 operates in the linear region in a light emitting device having the above structure according to the present invention, slight fluctuation in Vgs of the current control TFT 1404 does not affect the current value of the light emitting element 1405. In other words, the current value of the light emitting element 1405 can be determined by the driving TFT 1403 operating in the saturation region. With the above structure, variation in the luminance of the light emitting element due to the variation in the characteristics of the TFT can be reduced, thereby providing a light emitting device in which the image quality is improved.

In the pixels shown in FIGS. 25A to 25D, the switching TFT 1401 is to control input of the video signal to the pixel, and the video signal is inputted into the pixel when the switching TFT 1401 is turned ON. Then, the voltage of the video signal is held in the capacitor element 1402. Although FIGS. 25A and 25C show the structure in which the capacitor element 1402 is provided, the present invention is not limited thereto. When the gate capacitance or the like can serve as a capacitor holding the video signal, the capacitor element 1402 is not necessarily provided.

A pixel shown in FIG. 25B has the same pixel structure as that in FIG. 25A except for that a TFT 1406 and a scan line 1414 are added. Similarly, a pixel shown in FIG. 25D has the same pixel structure as that in FIG. 25C expect that the TFT 1406 and the scan line 1414 are added.

ON and OFF of the TFT 1406 is controlled by the additionally provided scan line 1414. When the TFT 1406 is turned ON, the charge held in the capacitor element 1402 is discharged; thus, the current control TFT 1404 is turned OFF. In other words, by the provision of the TFT 1406, a state can be produced forcedly in which the current does not flow into the light emitting element 1405. For this reason, the TFT 1406 can be referred to as an eraser TFT. Consequently, in the structures shown in FIGS. 25B and 25D, a lighting period can be started at the same time as or just after the start of a writing period before the writing of the signal into all the pixels; therefore the duty ratio can be improved.

Figure 25E:
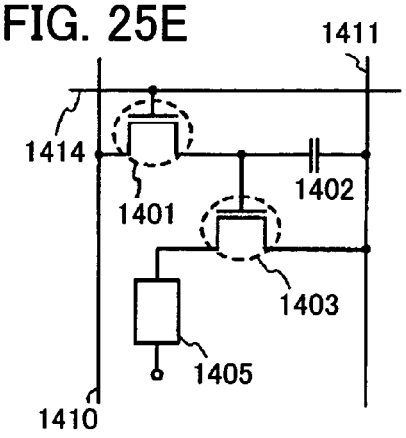
Figure 25F:
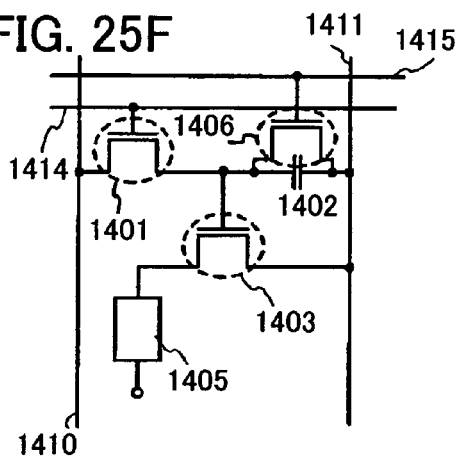

In a pixel shown in FIG. 25E, the signal line 1410 and the power source line 1411 are arranged in the column direction, and the scan line 1414 is arranged in the row direction. Further, the pixel includes the switching TFT 1401, the driving TFT 1403, the capacitor element 1402, and the light emitting element 1405. A pixel shown in FIG. 25F has the same pixel structure as one shown in FIG. 25E except for that the TFT 1406 and a scan line 1415 are added. In the structure shown in FIG. 25F, the duty ratio can be increased by the provision of the TFT 1406.

As thus described, various kinds of pixel circuits can be used. In particular, in the case of forming a thin film transistor from an amorphous semiconductor film, the semiconductor film of the driving TFT 1403 is preferably large. In the above pixel circuit, a top emission type is preferable in which light from the light emitting element is extracted from the counter substrate. Such an active matrix light emitting device can be driven at a low voltage when the pixel density increases, since the TFT is provided in each pixel, which is considered advantageous.

Although this embodiment mode describes the active matrix light emitting device in which a TFT is provided in each pixel, a passive matrix light emitting device is also applicable. Since TFTs are not provided in each pixel in a passive matrix light emitting device, high aperture ratio can be obtained. In the case of a light emitting device in which light is emitted from both sides of the light emitting element, the transmittance of the passive matrix light emitting device is increased.

Subsequently, a case where a diode is provided as a protective circuit on the scan line and the signal line with the use of an equivalent circuit shown in FIG. 25E will be described.

Figure 26:
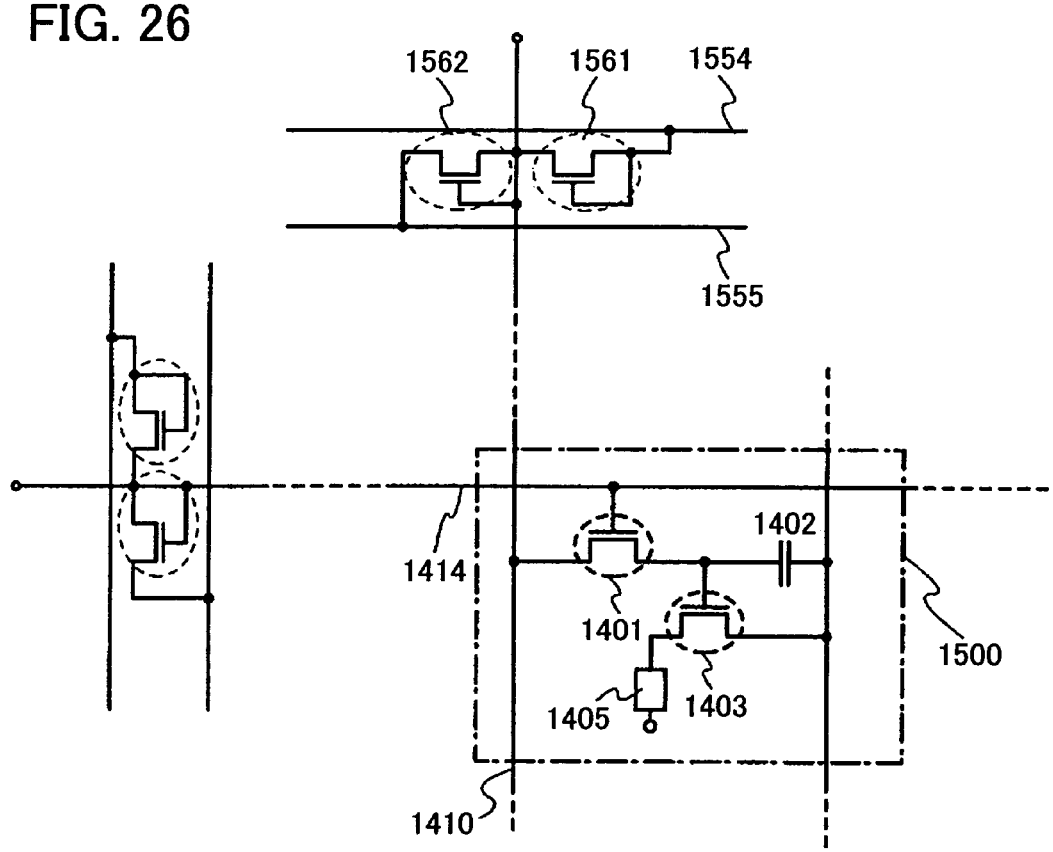
FIG. 26 is a circuit diagram showing a protective circuit of a light emitting device of Embodiment Mode 7.

In FIG. 26, the switching TFT 1401, the driving TFT 1403, the capacitor element 1402, and the light emitting element 1405 are provided in a pixel portion 1500. Diodes 1561 and 1562 are provided on the signal line 1410. In the similar way to the switching TFT 1401 or the driving TFT 1403, the diodes 1561 and 1562 are manufactured based on the above embodiments, and have a gate electrode, a semiconductor layer, a source electrode, a drain electrode, and the like. The diodes 1561 and 1562 are operated as diodes by connecting the gate electrode with the drain electrode or the source electrode.

Equipotential lines 1554 and 1555 connecting to the diodes are formed using the same layer as the gate electrode. Therefore, in order to connect the equipotential lines 1554 and 1555 with the source electrode or the drain electrode of the diode, it is necessary to form a contact hole in the gate insulating film. A diode provided on the scan line 1414 has the similar structure.

As thus described, according to the present invention, protective diodes provided in an input stage can be manufactured simultaneously. The position where the protective diode is formed is not limited to this, and the diode may also be provided between the driver circuit and the pixel. This embodiment mode can be combined with a suitable structure of the above embodiment modes as appropriate.

[Embodiment Mode 8]

In Embodiment Mode 8, electronic devices having light emitting devices according to the present invention and being mounted with modules of which example is shown in the previously described embodiment modes are described with reference to FIGS. 27A to 27E and FIG. 28.

As electronic devices, a video camera, a digital camera; a goggle type display (a head mounted display); a navigation system; an audio reproducing device (e.g., a car audio component); a computer; a game machine; a portable information terminal (e.g., a mobile computer, a cellular phone, a portable game machine, an electronic book, or the like); an image reproducing device equipped with a recording medium (specifically, a device which can reproduce the content of a recording medium such as a digital versatile disc (DVD) and which has a display for displaying an image stored therein); and the like can be given.

Figure 27A:
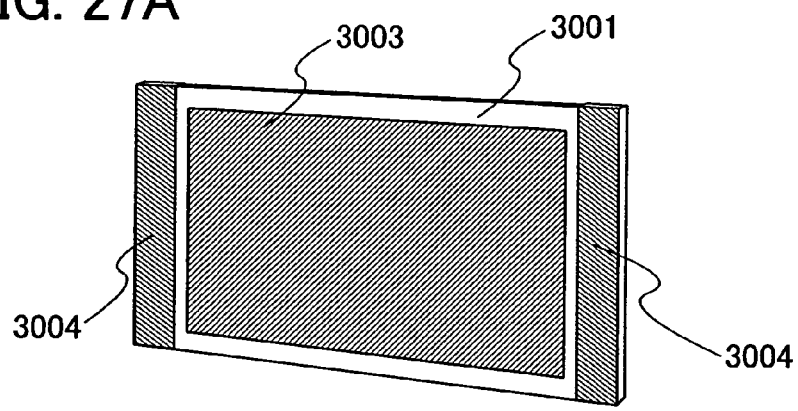
FIGS. 27A to 27E are perspective views showing examples of electronic devices according to Embodiment Mode 8.

FIG. 27A shows a monitor for a television receiver or a personal computer, or the like, including a housing 3001, a display area 3003, speakers 3004, and the like. An active matrix display device is provided in the display area 3003. Each pixel of the display area 3003 includes a TFT manufactured in accordance with the present invention. By using the TFT of the present invention, manufacturing time and cost for manufacturing can be reduced, and therefore, a television can be manufactured at low cost.

Figure 27B:
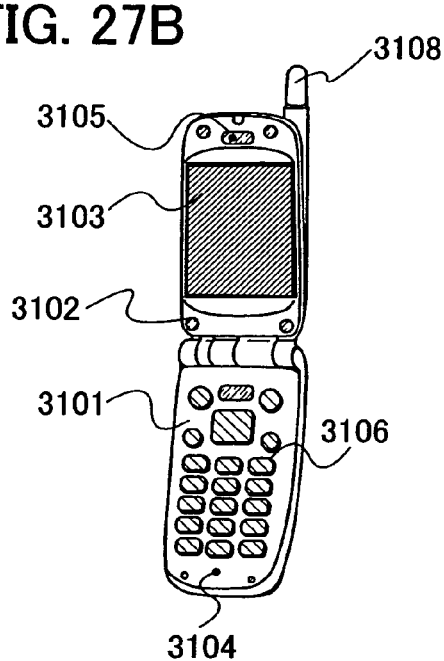

FIG. 27B shows a cellular phone, including a main body 3101, a housing 3102, a display area 3103, an audio input portion 3104, an audio output portion 3105, operation keys 3106, an antenna 3108, and the like. An active matrix display device is provided in the display area 3103. Each pixel of the display area 3103 includes a TFT manufactured in accordance with the present invention. By using the TFT of the present invention, manufacturing time and cost for manufacturing can be reduced, and therefore, a cellular phone can be manufactured at low cost.

Figure 27C:
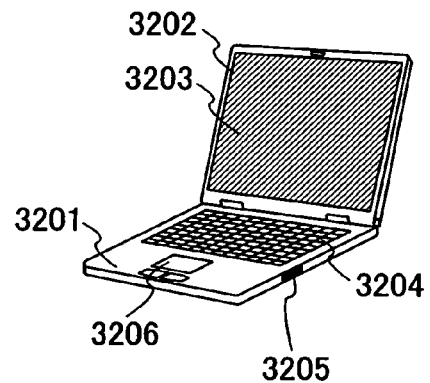

FIG. 27C shows a computer, including a main body 3201, a housing 3202, a display area 3203, a keyboard 3204, an external connection port 3205, a pointing mouse 3206, and the like. An active matrix display device is provided in the display area 3203. Each pixel of the display area 3203 includes a TFT manufactured in accordance with the present invention. By using the TFT of the present invention, manufacturing time and cost for manufacturing can be reduced, and therefore, a computer can be manufactured at low cost.

Figure 27D:
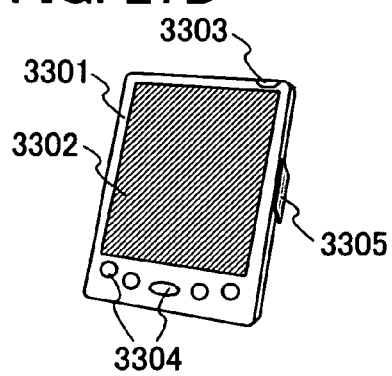

FIG. 27D shows a mobile computer, including a main body 3301, a display area 3302, a switch 3303, operation keys 3304, an infrared port 3305, and the like. An active matrix display device is provided in the display area 3302. Each pixel of the display area 3302 includes a TFT manufactured in accordance with the present invention. By using the TFT of the present invention, manufacturing time and cost for manufacturing can be reduced, and therefore, a mobile computer can be manufactured at low cost.

Figure 27E:
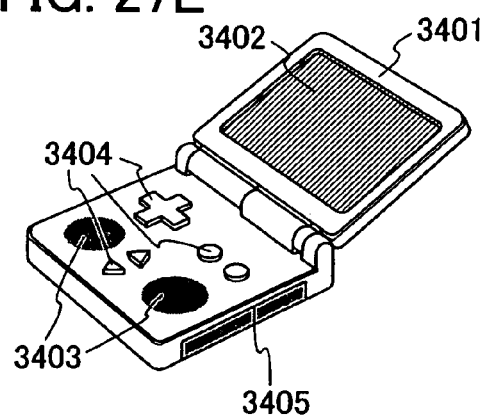

FIG. 27E shows a portable game machine, including a housing 3401, a display area 3402, speaker portions 3403, operation keys 3404, a recording medium insert portion 3405, and the like. An active matrix display device is provided in the display area 3402. Each pixel of the display area 3402 includes a TFT manufactured in accordance with the present invention. By using the TFT of the present invention, manufacturing time and cost for manufacturing can be reduced, and therefore, a portable game machine can be manufactured at low cost.

Figure 28:
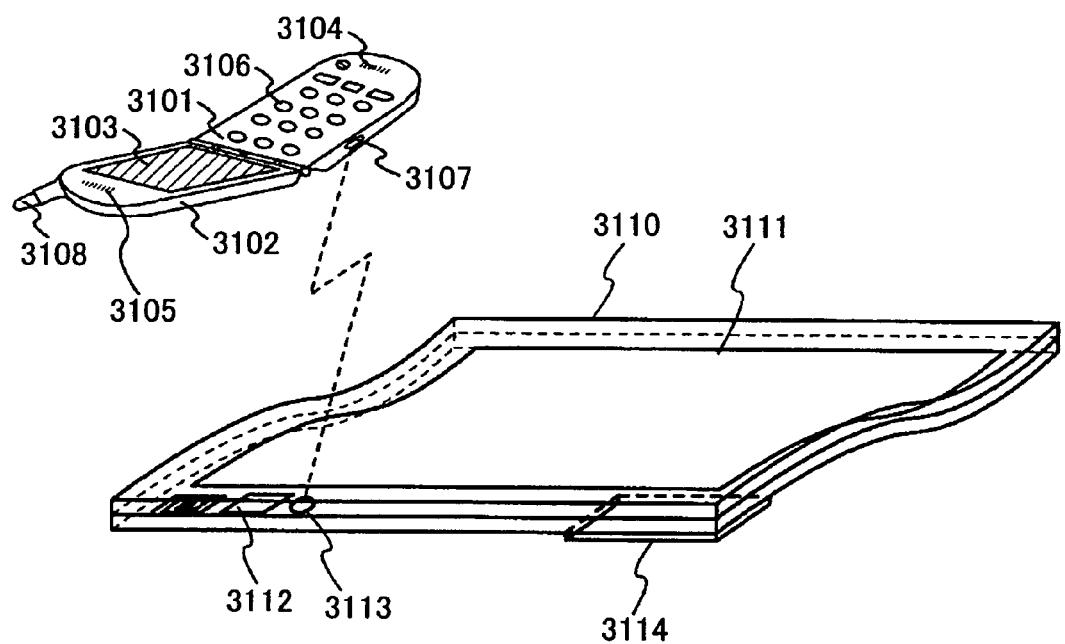
FIG. 28 is a perspective view showing an example of the electronic device according to Embodiment Mode 8.

FIG. 28 shows a paper display, including a main body 3110, a pixel portion 3111, a driver IC 3112, a receiving device 3113, a film buttery 3114, and the like. The receiving device 3113 can receive a signal from an infrared communication port 3107 of the above described cellular phone. An active matrix display device is provided in the pixel portion 3111. Each pixel of the pixel portion 3111 includes a TFT manufactured in accordance with the present invention. By using the TFT of the present invention, manufacturing time and cost for manufacturing can be reduced, and therefore, a paper display can be manufactured at low cost.

As set forth above, the application range of the present invention is extremely wide, and the present invention can be applied to electronic devices in all fields.

This application is based on Japanese Patent Application serial No. 2005-281610 filed in Japan Patent Office on Sep. 28, 2005, the entire contents of which are hereby incorporated by reference.

What is claimed is:

1. An exposure method comprising the steps of:
    providing a mask having a first opening pattern in which a first plurality of openings have approximately the same size and are arranged in a first line at approximately the first same interval and a second opening pattern in which a second plurality of openings have approximately the same size and are arranged in a second line at approximately the second same interval;
    providing a substrate on a stage;
    irradiating a pair of slits above the mask with a linear laser beam so that a part of the linear laser beam passes through the pair of slits;
    irradiating the mask with the part of the linear laser beam so that a first plurality of exposure laser beams is formed by a first part of the first plurality of openings; and
    irradiating a film over the substrate with the first plurality of exposure laser beams while moving the stage to perform exposure, thereby forming a first plurality of exposed patterns at approximately the same interval in the film at the same time,
    wherein the pair of slits is configured to cover a second part of the first plurality of openings and a part of the second plurality of openings, and
    wherein the first same interval between the first plurality of openings is different from the second same interval between the second plurality of openings.

2. The exposure method according to claim 1, wherein each of shapes of the first plurality of openings is a circle, an ellipse, or a polygon.

3. The exposure method according to claim 1, wherein one part of the linear laser beam is blocked for light shielding when performing the linear laser beam irradiation along the first opening pattern or the second opening pattern.

4. The exposure method according to claim 1,
    wherein the mask comprises a first substrate and a metal film provided with the first plurality of openings and the second plurality of openings under the first substrate, and
    wherein a side of the metal film has a shape perpendicular to a surface of the first substrate.

5. A manufacturing method of a device, comprising the steps of:
    providing a mask having a first opening pattern in which a first plurality of openings have approximately the same size and are arranged in a first line at approximately the first same interval and a second opening pattern in which a second plurality of openings have approximately the same size and are arranged in a second line at approximately the second same interval;
    providing a substrate on a stage;
    irradiating a pair of slits above the mask with a linear laser beam so that a part of the linear laser beam passes through the pair of slits;
    irradiating the mask with the part of the linear laser beam so that a first plurality of exposure laser beams is formed by a first part of the first plurality of openings; and
    irradiating a film over the substrate with the first plurality of exposure laser beams while moving the stage to perform exposure, thereby forming a first plurality of exposed patterns at approximately the same interval in the film at the same time,
    wherein the pair of slits is configured to cover a second part of the first plurality of openings and a part of the second plurality of openings, and
    wherein the first same interval between the first plurality of openings is different from the second same interval between the second plurality of openings.

6. The manufacturing method according to claim 5, wherein each of shapes of the first plurality of openings is a circle, an ellipse, or a polygon.

7. The manufacturing method according to claim 5, wherein one part of the linear laser beam is blocked for light shielding when performing the linear laser beam irradiation along the first opening pattern or the second opening pattern.

8. The manufacturing method according to claim 5,
    wherein the mask comprises a first substrate and a metal film provided with the first plurality of openings and the second plurality of openings under the first substrate, and
    wherein a side of the metal film has a shape perpendicular to a surface of the first substrate.

9. A manufacturing method of a device, comprising the steps of:
    providing a mask having a first opening pattern in which a first plurality of openings have approximately the same size and are arranged in a first line at approximately the first same interval and a second opening pattern in which a second plurality of openings have approximately the same size and are arranged in a second line at approximately the second same interval;
    aligning the mask by an alignment marker on the mask, providing a substrate on a stage;
    irradiating the mask with a linear laser beam so that a part of the linear laser beam passes through the first plurality of openings, thereby forming a first plurality of exposure laser beams;
    irradiating a film over the substrate with the first plurality of exposure laser beams while moving the stage to perform exposure, thereby forming a first plurality of exposed patterns at approximately the same interval in the film at the same time,
    wherein the first same interval between the first plurality of openings is different from the second same interval between the second plurality of openings.

10. The manufacturing method according to claim 9, wherein each of shapes of the first plurality of openings is a circle, an ellipse, or a polygon.

11. The manufacturing method according to claim 9, wherein one part of the linear laser beam is blocked for light shielding when performing the linear laser beam irradiation along the first opening pattern or the second opening pattern.

12. The manufacturing method according to claim 9,
    wherein the mask comprises a first substrate and a metal film provided with the first plurality of openings and the second plurality of openings under the first substrate, and
    wherein a side of the metal film has a shape perpendicular to a surface of the first substrate.

* * * * *